(12) United States Patent
Shibayama

(10) Patent No.: US 6,920,079 B2
(45) Date of Patent: Jul. 19, 2005

(54) SEMICONDUCTOR DEVICE AND SEMICONDUCTOR MEMORY DEVICE

(75) Inventor: Akinori Shibayama, Muko (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/902,133

(22) Filed: Jul. 30, 2004

(65) Prior Publication Data

US 2005/0041499 A1 Feb. 24, 2005

(30) Foreign Application Priority Data

Aug. 8, 2003 (JP) ........................................ 2003-290639

(51) Int. Cl.[7] .................................................. G11C 7/00
(52) U.S. Cl. .................................. 365/230.06; 365/210
(58) Field of Search ........................... 365/230.06, 210, 365/63, 51

(56) References Cited

U.S. PATENT DOCUMENTS 6,088,286 A * 7/2000 Yamauchi et al. ..... 365/230.06
6,242,782 B1   6/2001 Casper et al.
6,646,300 B2 * 11/2003 Ishii et al. .................. 257/316

FOREIGN PATENT DOCUMENTS

JP      2001-344989      12/2001

* cited by examiner

Primary Examiner—Vu A. Le
(74) Attorney, Agent, or Firm—McDermott Will & Emery LLP

(57) ABSTRACT

A semiconductor memory device according to the present invention includes: a plurality of N-ch MOS transistors arranged in an area surrounding a plurality of memory cells arranged in an array, at a spacing depending on a spacing of the plurality of memory cells, for driving the plurality of memory cells; and a plurality of dummy transistors 32-$j$ each of which is formed between two adjacent ones of the plurality of N-ch MOS transistors 30-$k$ so as to share diffusion layers with adjacent N-ch MOS transistors 30 and each of which has a gate electrode supplied with a voltage for electrically insulating these adjacent transistors 30-$k$.

16 Claims, 18 Drawing Sheets

SEMICONDUCTOR DEVICE AND SEMICONDUCTOR MEMORY DEVICE

BACKGROUND OF THE INVENTION

1. Field of the Invention

The present invention relates to a semiconductor device and, more specifically, a semiconductor device in which a plurality of elements identical in structure are arranged in an array.

2. Description of the Background Art

FIG. 13 is a block diagram showing the configuration of a conventional static random access memory (SRAM). With reference to FIG. 13, the conventional SRAM is described.

The SRAM shown in FIG. 13 includes a memory cell array 1001, a second dummy memory cell array row 1002, a second dummy memory cell array column 1003, a first dummy memory cell array row 1004, a first dummy memory cell array column 1005, a word driver block 1006, a row decoder block 1007, a switch block 1012, and a sense amplifier block 1015.

The memory cell array 1001, the second dummy memory cell array row 1002, the second dummy memory cell array column 1003, the first dummy memory cell array row 1004, and the first dummy memory cell array column 1005 have the configuration shown in FIG. 14. Specifically, in the memory cell array 1001, 256 bit lines BL[f] (f is an integer from 0 to 255) and 256 inverted bit lines NBL[f] are alternately arranged in the height direction, while 128 word lines WL[w] (w is an integer from 0 to 127) are arranged in the width direction. Memory cells MC are arranged in an array, and each memory cell MC is placed between a bit line BL[f] and an inverted bit line NBL[f] that have the same value of f.

Also, the memory cell array 1001 is surrounded by the second dummy memory cell array row 1002, the second dummy memory cell array column 1003, the first dummy memory cell array row 1004, and the first dummy memory cell array column 1005. The second dummy memory cell array row 1002, the second dummy memory cell column 1003, the first dummy memory cell array row 1004, and the first dummy memory cell array column 1005 each include dummy memory cells D1 and D2 that do not operate. The dummy memory cells D1 and D2 are connected to either one of a set of the dummy bit line DBL[0] and the inverted dummy bit line DNBL[0], a set of the dummy word lines DWL[2] and DWL[3], a set of the dummy word lines DWL[0] and DWL[1], and a set of the dummy bit line DBL[1] and the inverted dummy bit line DNBL[1].

As shown in FIG. 13, the word driver block 1006 is placed to the left of the first dummy memory cell array column 1005 shown in FIG. 14. Further, the row decoder block 1007 is placed to the left of the word driver block 1006. FIG. 15 is an illustration showing the circuitry configuration of the row decoder block 1007 and the word driver block 1006.

As shown in FIG. 15, the row decoder block 1007 has arranged therein a plurality of row decoders. The word driver block 1006 is provided with a plurality of word drivers 40-k (k is an integer from 1 to 128) correspondingly to the row decoders. Each word driver 40-k is a Complementary MOS (CMOS) inverter formed of one N-ch MOS transistor 30-k and one P-ch MOS transistor 31-k. Each word driver 40-k switches a potential of the connected word line WL[w] High or Low.

Here, with reference to FIG. 16, an arrangement of transistors in the word driver block 1006 is described below.

FIG. 16 is an illustration showing an arrangement of the N-ch MOS transistors 30-k and the P-ch MOS transistors 31-k in the word driver block 1006. In FIG. 16, hatched rectangular portions each represent a transistor diffusion layer, while hollowed rectangular portions each represent a gate electrode.

An N-ch MOS transistor 30-k and a P-ch MOS transistor 31-k forming a word driver 40-k are arranged side by side in the width direction as shown in FIG. 16. Also, pairs of one N-ch MOS transistor 30-k and one P-ch MOS transistor. 31-k are arranged in the height direction at a spacing approximately equal to that of the memory cells MC arranged in the memory cell array 1001 in the height direction.

Next, the switch block 1012 and the sense amplifier block 1015 are described. As shown in FIG. 13, the switch block 1012 is placed at the lower side of the first dummy memory cell array row 1004, and the sense amplifier block 1015 is placed at the lower side of the switch block 1012. FIG. 17 is an illustration showing a circuitry configuration of the switch block 1012 and the sense amplifier block 1015.

The 256 bit lines BL[f] and the 256 inverted bit lines NBL[f], which are arranged longitudinally across the memory cell array 1001, extend to as far as the inside of switch block 1012. In the switch block 1012, 512 P-ch MOS transistor 50-n (n is an integer from 1 to 512) and 512 N-ch MOS transistor 51-n are formed. Each bit line BL[f] and inverted bit line NBL[f] is connected to one P-ch MOS transistor 50-n and one N-ch MOS transistor 51-n to form a switch 60-s (s is an integer from 1 to 512).

Also, each switch 60-s is connected to a data line DL[p] (p is an integer from 0 to 127) and an inverted data line NDL[p] extending to the inside of the sense amplifier block 1015. Therefore, 128 data lines DL[p] and 128 inverted data lines NDL[p] are provided in total. Furthermore, in the sense amplifier block 1015, 256 P-ch MOS transistors 52-m (m is an integer from 1 to 256) and 256 N-ch MOS transistor 53-m are formed. Each data line DL[p] and inverted data line NDL[p] is connected to two P-ch MOS transistors 52-m and two N-ch MOS transistors 53-m forming a sense amplifier 70-r (r is an integer from 1 to 128).

FIG. 18 is an illustration showing an arrangement of transistors in the switch block 1012 and the sense amplifier block 1015. In the switch block 1012, pairs of one P-ch MOS transistor 50-n and one N-ch MOS transistor 51-n are arranged in the height direction. These pairs of the P-ch MOS transistor 50-n and the N-ch MOS transistor 51-n are arranged in the width direction in FIG. 18 at a spacing approximately equal to that of the memory cells MC in the width direction.

Also, in the sense amplifier block 1015, pairs of one P-ch MOS transistor 52-m and one N-ch MOS transistor 53-m are arranged in the height direction. Here, the number of pairs of the P-ch MOS transistor 52-m and the N-ch MOS transistor 53-m included in the sense amplifier block 1015 is half of the number of pairs of the P-ch MOS transistor 50-n and the N-ch MOS transistor 51-n included in the switch block 1012. One pair of the P-ch MOS transistor 52-m and the N-ch MOS transistor 53-m in the sense amplifier block 1015 is provided to every other pair of the P-ch MOS transistor 50-n and the N-ch MOS transistor 51-n in the switch block 1012. Specifically, as shown in FIG. 18, a pair of the P-ch MOS transistor 52-m and the N-ch MOS transistor 53-m is placed at the lower side of a pair of the P-ch MOS transistor 50-n and the N-ch MOS transistor 51-n where n is an even number.

As described above, in the conventional memory, the spacing of the transistors in the word driver block 1006, the row decoder block 1007, the switch block 1012, and the sense amplifier block 1015 depends on the spacing of the memory cells in the memory cell array 1001. Also, with the above configuration being applied to the respective components of the memory, data can be written into or read from the memory cells. Such a conventional memory is exemplarily disclosed in Japanese Patent Laid-Open Publication No. 2001-344989 (p. 9, FIG. 1).

Here, of diffusion layers (sources and drains) of the N-ch MOS transistors 30-*k*, 51-*n*, and 53-*m* and the P-ch MOS transistors 31-*k*, 50-*n*, and 52-*m* shown in FIGS. 16 and 18, adjacent diffusion layers are isolated through Shallow Trench Isolation (STI). As such, when the adjacent diffusion layers are isolated through STI, a large stress occurs between an oxide film for isolation and the diffusion layers, thereby causing a large number of defects in the vicinity of an interface between the oxide film and the diffusion layers. With such defects in the vicinity of a gate electrode, an electric current flowing through the N-ch MOS transistor is reduced. However, such occurrence of defects has not posed a significant problem in the conventional technology because a distance La from a gate electrode to an end of a diffusion layer shown in FIGS. 16 and 18 is relatively long.

However, in recent years, microfabrication of elements, such as transistors, has been in rapid progress. Also, in designing of memories or the like, a minimum value or a value close to the minimum value in design rules is used in general. Therefore, compared with the conventional technology, the distance La from the gate electrode to the end of the diffusion layer in the N-ch MOS transistors 30-*k*, 51-*n*, and 53*m* exemplarily shown in FIGS. 16 and 18 has become shortened. As such, with the distance La from the gate electrode to the end of the diffusion layer being shortened, a reduction of the electric current in the N-ch MOS transistors 30-*k*, 51-*n*, and 53-*m* becomes significant, thereby destablizing the operation of the memory.

The above-described problem can be solved exemplarily by increasing the distance from the gate electrode to the end of the diffusion layer of the N-ch MOS transistor. This makes it possible to prevent the amount of electric current flowing through the N-ch MOS transistor from being reduced due to defects caused by stress in the vicinity of the interface between the oxide film and the diffusion layers.

However, as the distance between the gate electrode to the end of the diffusion layer is increased, the spacing of the transistors is also increased. This hinders a semiconductor memory device from being made compact.

Moreover, as described above, the spacing of the transistors in the word driver block 1006, the sense amplifier block 1015, and the switch block 1012 depends on the spacing of the memory cells in the memory cell array. For example, the N-ch MOS transistors 30-*k* in the word driver block 1006 are arranged at a spacing approximately equal to that of the memory cells MC in the memory cell array. Therefore, as the distance from the gate electrode to the end of the diffusion layer of the N-ch MOS transistor 30-*k* is increased, the spacing of the N-ch MOS transistors are not matched with the spacing of the memory cells MC.

SUMMARY OF THE INVENTION

Therefore, an object of the present invention is to stabilize a circuit operation of a semiconductor device in which storage elements are arranged in an array and are surrounded by a large number of transistors regularly arranged, and to make such a semiconductor device compact.

A semiconductor memory device according to the present invention includes: a plurality of transistors arranged in an area surrounding the plurality of memory cells arranged in the array, at a spacing depending on a spacing of the plurality of memory cells, the plurality of transistors for driving the plurality of memory cells; and a plurality of dummy transistors each of which is formed between two adjacent ones of the plurality of transistors so as to share diffusion layers with the adjacent transistors and each of which has a gate electrode supplied with a voltage for electrically insulating the adjacent transistors. Preferably, the plurality of transistors are N-ch MOS transistors.

A plurality of P-ch MOS transistors may be arranged in parallel to the plurality of N-ch MOS transistors in the area surrounding the plurality of memory cells arranged in the array. Here, preferably, an N-ch MOS transistor located at an end of an arrangement of the plurality of N-ch transistors has a diffusion layer that is longer than a diffusion layer of a P-ch MOS transistor located at an end of an arrangement of the plurality of P-ch transistors. Also, at least one of the dummy transistors may be formed outside of the N-ch MOS transistor located at the end.

Here, the plurality of memory cells may be arranged in the array in a first rectangular area. Also, the semiconductor memory device may further includes a plurality of unoperable dummy memory cells arranged so as to surround sides of the first rectangular area. Furthermore, the plurality of N-ch MOS transistors may be arranged in a second rectangular area adjacent to a dummy-memory-cell area in which the plurality of dummy memory cells are arranged and having one side corresponding to one side of the first rectangular area. Still further, an N-ch MOS transistor located at an end of an arrangement of the N-ch MOS transistors in the second rectangular are a may have an active region extending to a third area that is in contact with the second rectangular area that includes the plurality of N-ch MOS transistors and in contact with a part of one side of the dummy-memory-cell area. Still further, at least one of the dummy transistors may be formed on the active region extending to the third area.

Here, the plurality of N-ch MOS transistors and the plurality of P-ch MOS transistors may be respectively isolated through shallow Trench Isolation (STI).

The plurality of N-ch MOS transistors and the plurality of P-ch MOS transistors may be used for word drivers for driving a plurality of word lines for selecting a row of the memory cells arranged in the array. In this case, one of the plurality of N-ch MOS transistors and one of the plurality of P-ch MOS transistors form a CMOS inverter. Also, an output of the CMOS inverter is coupled to a word line and a diffusion layer of one of the dummy transistors.

Still further, the plurality of N-ch MOS transistors and the plurality of P-ch MOS transistors may be used for a plurality of switches for driving a plurality of bit lines for reading a signal from the plurality of memory cells. In this case, each of the switches is configured by connecting a diffusion layer of one of the N-ch MOS transistors and a diffusion layer of one of the P-ch MOS transistors together and connecting a gate of the one of the N-ch MOS transistors and a gate of the one of the P-ch MOS transistors through a signal line.

Still further, the plurality of N-ch MOS transistors and the plurality of P-ch MOS transistors may be used for a plurality of sense amplifiers that amplify the signal read from the plurality of memory cells. In this case, each of the dummy transistors is placed so as to connect diffusion layers of N-ch MOS transistors included in adjacent sense amplifiers.

Furthermore, a diffusion layer of each of the dummy transistors may be connected to a signal line to which the signals amplified by the sense amplifier is output.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
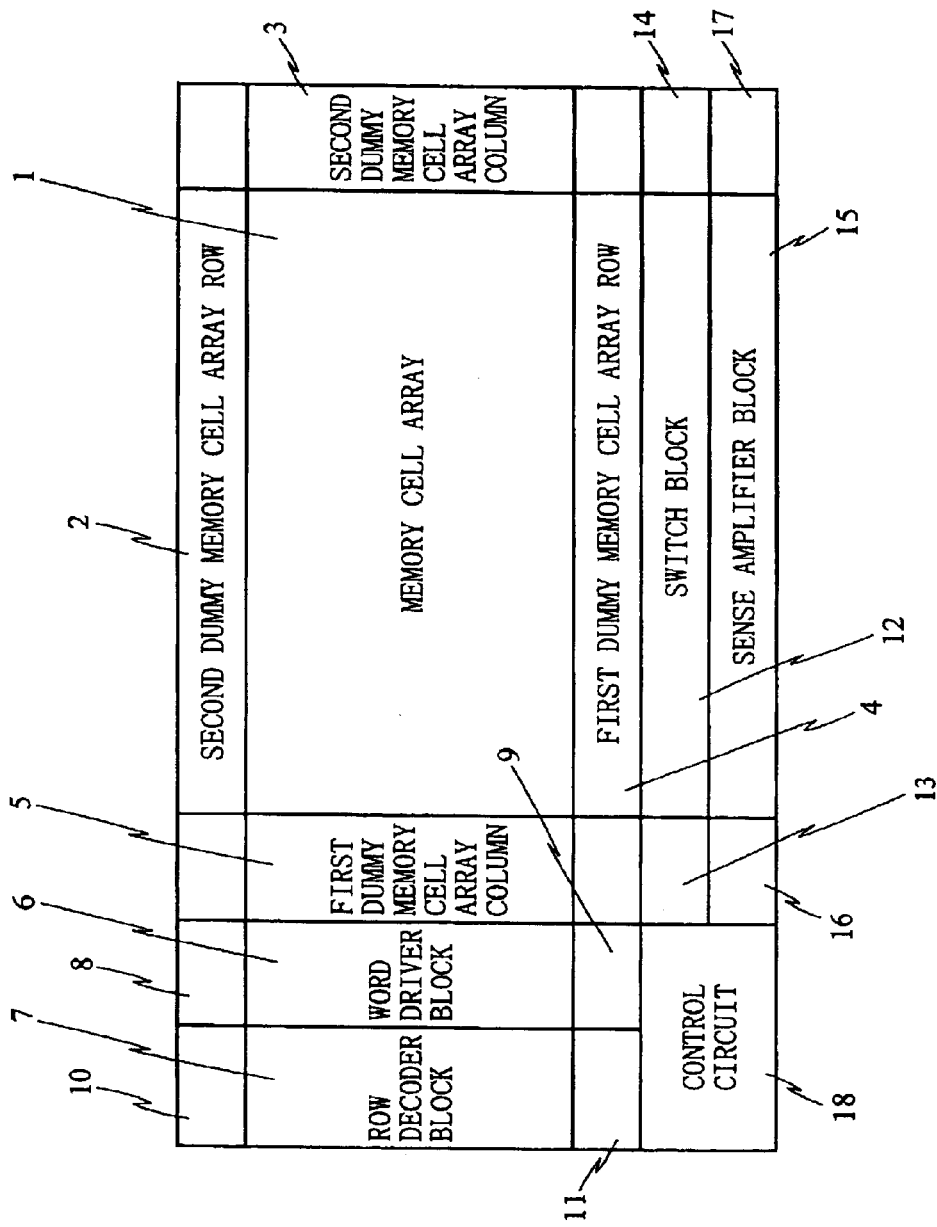
FIG. 1 is a block diagram showing a configuration of a semiconductor memory device according to the present invention.

With reference to the drawings, a semiconductor memory device according to an embodiment of the present invention is described below. FIG. 1 is a block diagram showing the entire configuration of a semiconductor memory device according to the present embodiment. The semiconductor memory device shown in FIG. 1 is a 32-bit Static Random Access Memory (SRAM).

The semiconductor memory device shown in FIG. 1 includes a memory cell array 1, a second dummy memory cell array row 2, a second dummy memory cell array column 3, a first dummy memory cell array row 4, a first dummy memory cell array column 5, a word driver block 6, a row decoder block 7, a first dummy word driver block 8, a second dummy word driver block 9, a first dummy row decoder block 10, a second dummy row decoder block 11, a switch block 12, a first dummy switch block 13, a second dummy switch block 14, a sense amplifier block 15, a first dummy sense amplifier block 16, a second dummy sense amplifier block 17, and a control circuit 18.

Figure 14:
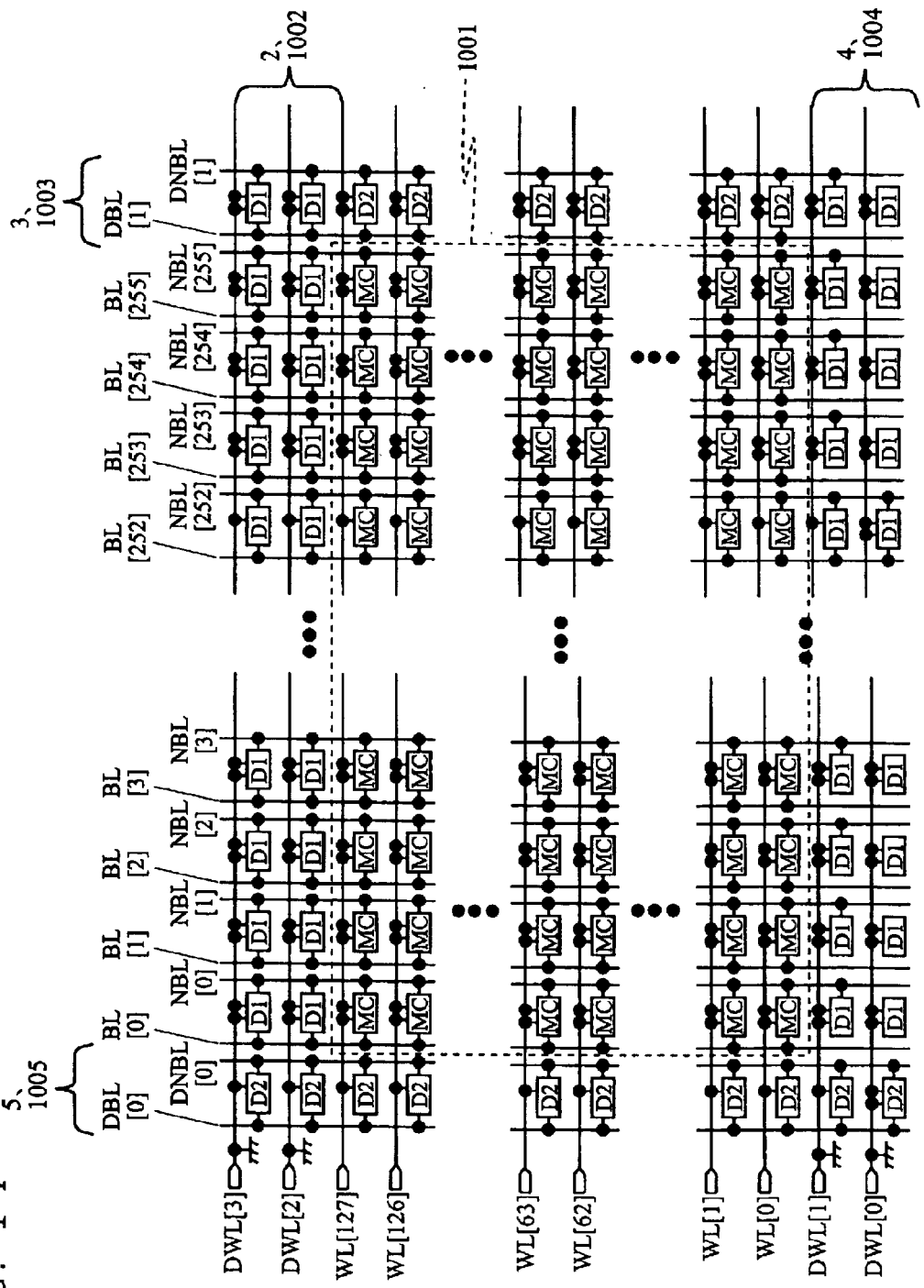
FIG. 14 is an illustration showing a configuration of a memory cell array, first and second dummy memory cell array columns, and first and second dummy memory cell array rows of the conventional semiconductor memory device.
Figure 15:
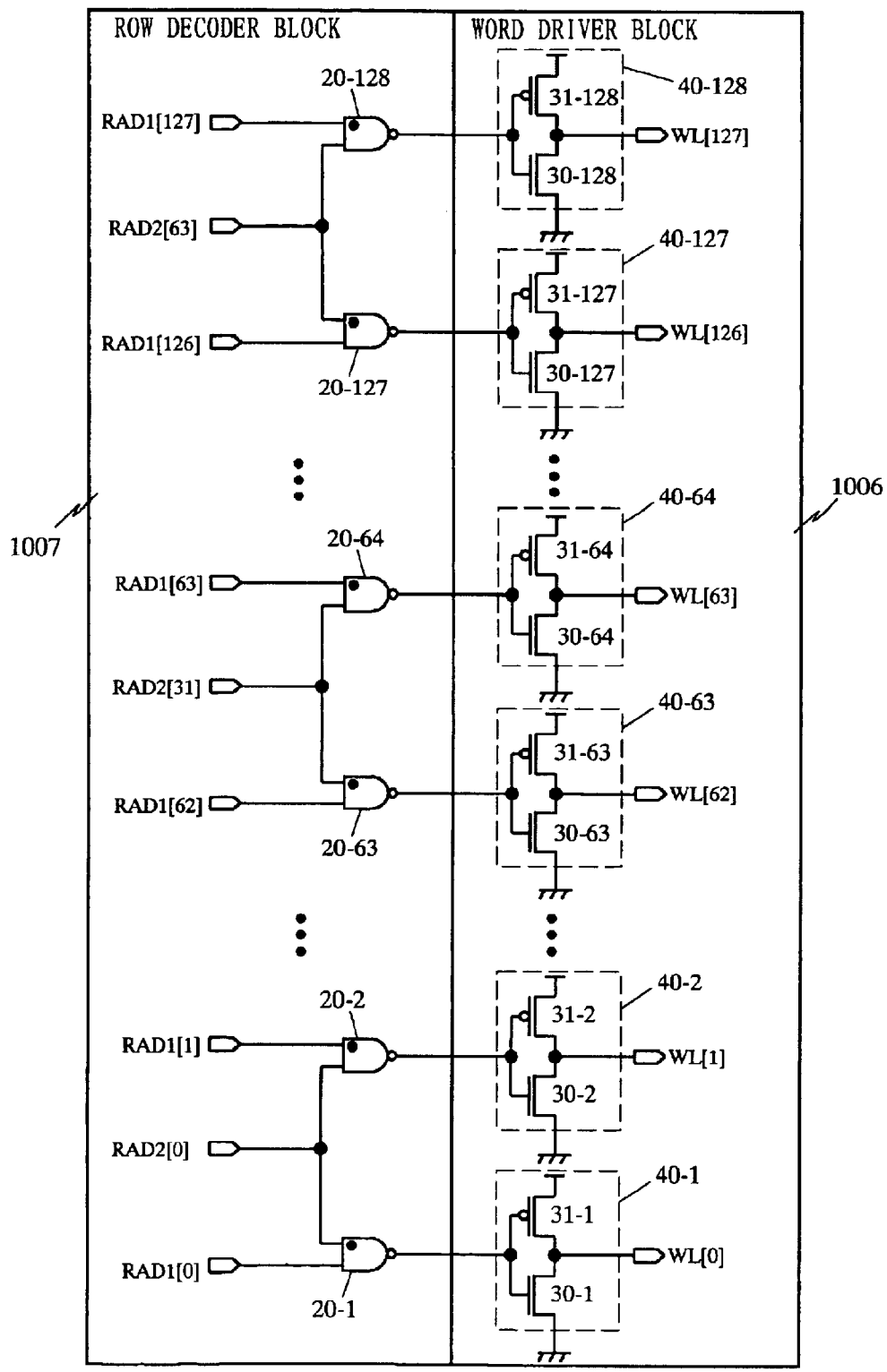
FIG. 15 is an illustration showing a circuitry configuration of a conventional row decoder block and a conventional word driver block.
Figure 16:
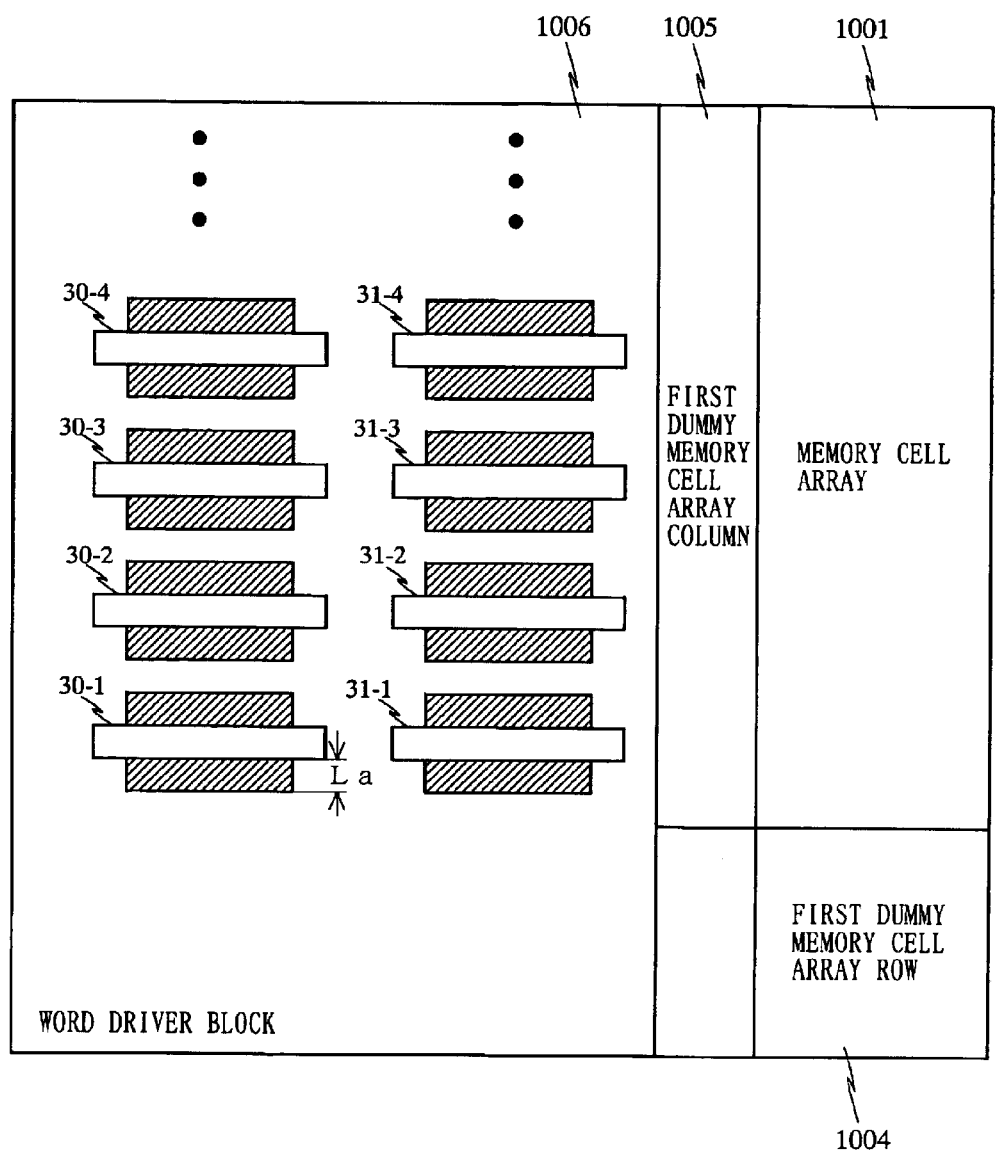
FIG. 16 is an illustration showing an arrangement of transistors in the conventional word driver block.

FIG. 14 is an illustration showing a configuration of the memory cell array 1, the second dummy memory cell array row 2, the second dummy memory cell array column 3, the first dummy memory cell array row 4, and the first dummy memory cell array column 5. In FIG. 14, MC denotes a memory cell, D1 denotes an unoperable dummy memory cell provided in a row direction, and D2 denotes an unoperable dummy memory cell provided in a column direction.

As shown in FIG. 14, in the memory cell array 1, 256 bit lines BL[f] (f is an integer from 0 to 255) and 256 inverted bit lines NBL[f] are alternately arranged in the height direction, while 128 word lines WL[w] (w is an integer from 0 to 127) are arranged in the width direction. The memory cells MC are arranged in an array, and each memory cell is placed between a bit line[f] and an inverted bit line[f] that have the same value of f.

Also, the memory cell array 1 has a rectangular shape with its four sides surrounded by the second dummy memory cell array row 2, the second dummy memory cell array column 3, the first dummy memory cell array row 4, and the first dummy memory cell array column 5. The second dummy memory cell array row 2, the second dummy memory cell array column 3, the first dummy memory cell array row 4, and the first dummy memory cell array column 5 each include dummy memory cells D1 and D2 that do not operate. The dummy memory cells D1 and D2 are connected to either one of a set of the dummy bit line DBL[0] and the inverted dummy bit line DNBL[0], a set of the dummy word lines DWL[2] and DWL[3], a set of the dummy word lines DWL[0] and DWL[1], and a set of the dummy bit line DBL[1] and the inverted dummy bit line DNBL[1].

Figure 2:
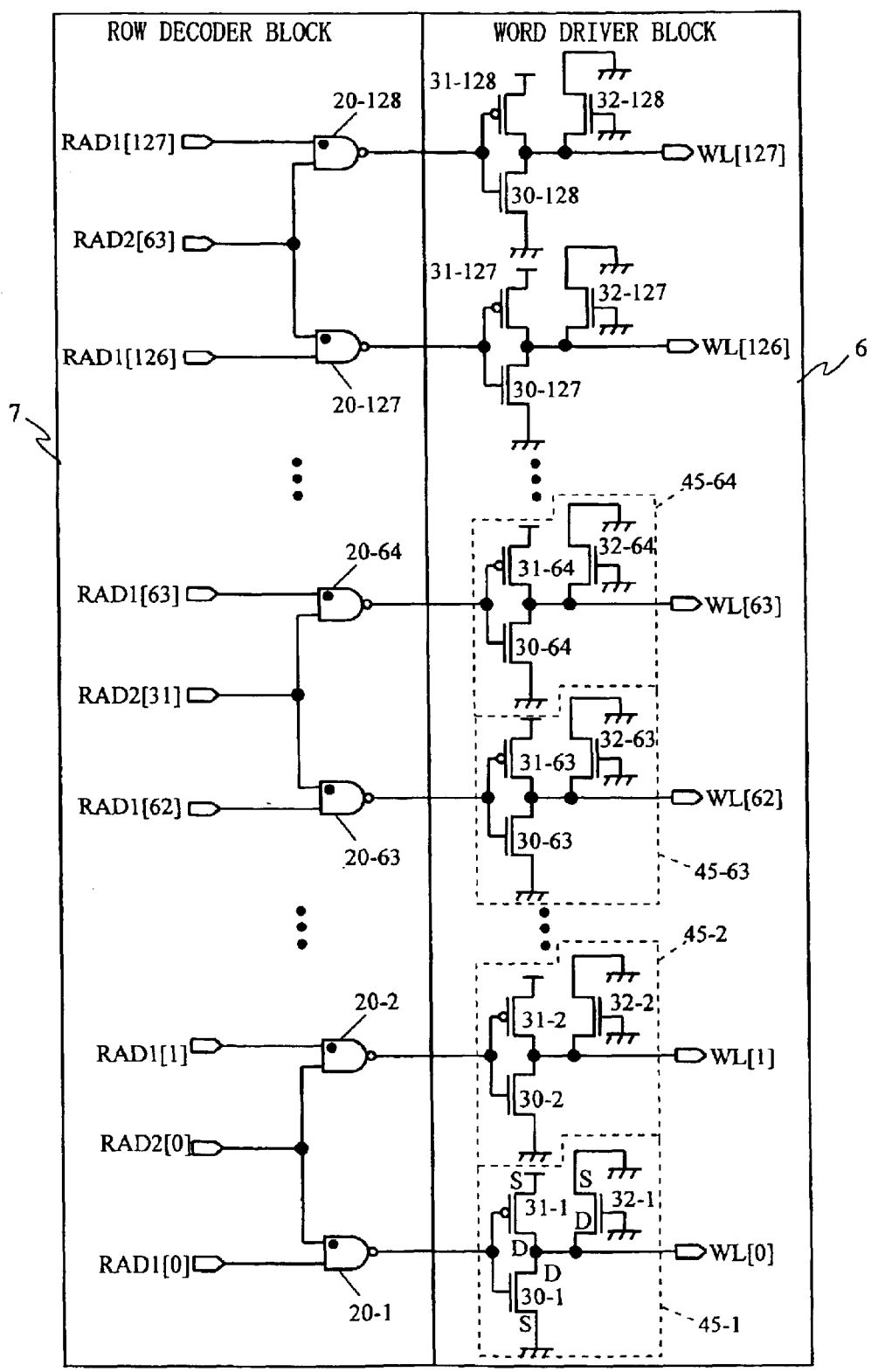
FIG. 2 is an illustration showing a circuitry configuration of a row decoder block and a word driver block of the semiconductor memory device according to the present invention.

As shown in FIG. 1, the word driver block 6 is placed to the left of the first dummy memory cell array column 5, and the row decoder block 7 is placed to the left of the word driver block 6. The word driver block 6 and the row decoder block 7 forms a rectangular area including two sides each equal to one side of the memory cell array. With reference to FIG. 2, the circuitry configuration of the word driver block 6 and the row decoder block 7 is described below.

The row decoder block 7 performs decoding based on an input row address to select a word line WL[w] of the relevant memory cell. As shown in FIG. 2, the row decoder block 7 includes 128 NAND circuits 20-$c$ ($c$ is an integer from 1 to 128). One NAND circuit 20-$c$ is provided to each word line WL[w]. Each NAND circuit 20-$c$ is supplied with row address signals RAD1 and RAD2. Two adjacent NAND circuits 20-$c$ forming a pair are supplied with one row address signal RAD2.

The word driver block 6 drives a word line WL[w] connected to the relevant memory cell MC based on the signal output from the row decoder block 7. The word driver block 6 includes 128 word drivers 45-$k$ ($k$ is an integer from 1 to 128) corresponding to the word lines WL[w]. Each word driver 45-$k$ includes a CMOS inverter formed of one N-ch MOS transistor 30-$k$ and one P-ch MOS transistor 31-$k$ both having the same value of k as the value of k of the relevant word driver 45-$k$, and one N-ch MOS transistor 32-$j$ ($j$ is an integer from 1 to 128). Each CMOS inverter forming one word driver 45-$k$ inverts an output value of the relevant NAND circuit 20-$c$ for output to the relevant word line WL[w].

Next, with reference to FIG. 2, the circuitry configuration of the word driver block 6 is described in detail. Note that, in FIG. 2, an alphabet S denotes a source, while an alphabet D denotes a drain. For example, the CMOS inverter connected to the word line WL[0] includes the N-ch MOS transistor 30-1 and the P-ch MOS transistor 31-1. The P-ch MOS transistor 31-1 is applied at its source with a power supply voltage having a predetermined magnitude. Also, the source of the N-ch MOS transistor 30-1 is grounded. The gate of the N-ch MOS transistor 30-1 and the gate of the P-ch MOS transistor 31-1 are connected to each other, and are further connected to an output section of the NAND circuit 20-1. The drain of the N-ch MOS transistor 30-1 and the drain of the P-ch MOS transistor 31-1 are connected to each other, and are further connected to the word line WL[0]. Also, the drain of the N-ch MOS transistor 32-1 is connected to the drains of the N-ch MOS transistor 30-1 and the P-ch MOS transistor 31-1. The gate and source of the N-ch MOS transistor 32-1 are grounded so that the N-ch MOS transistor 32-1 does not operate.

Note that the sources and the drains are used in the above for the purpose of easy description of a connecting state of each transistor. In practice, however, each diffusion layer is not fixed as a source or a drain.

Figure 3:
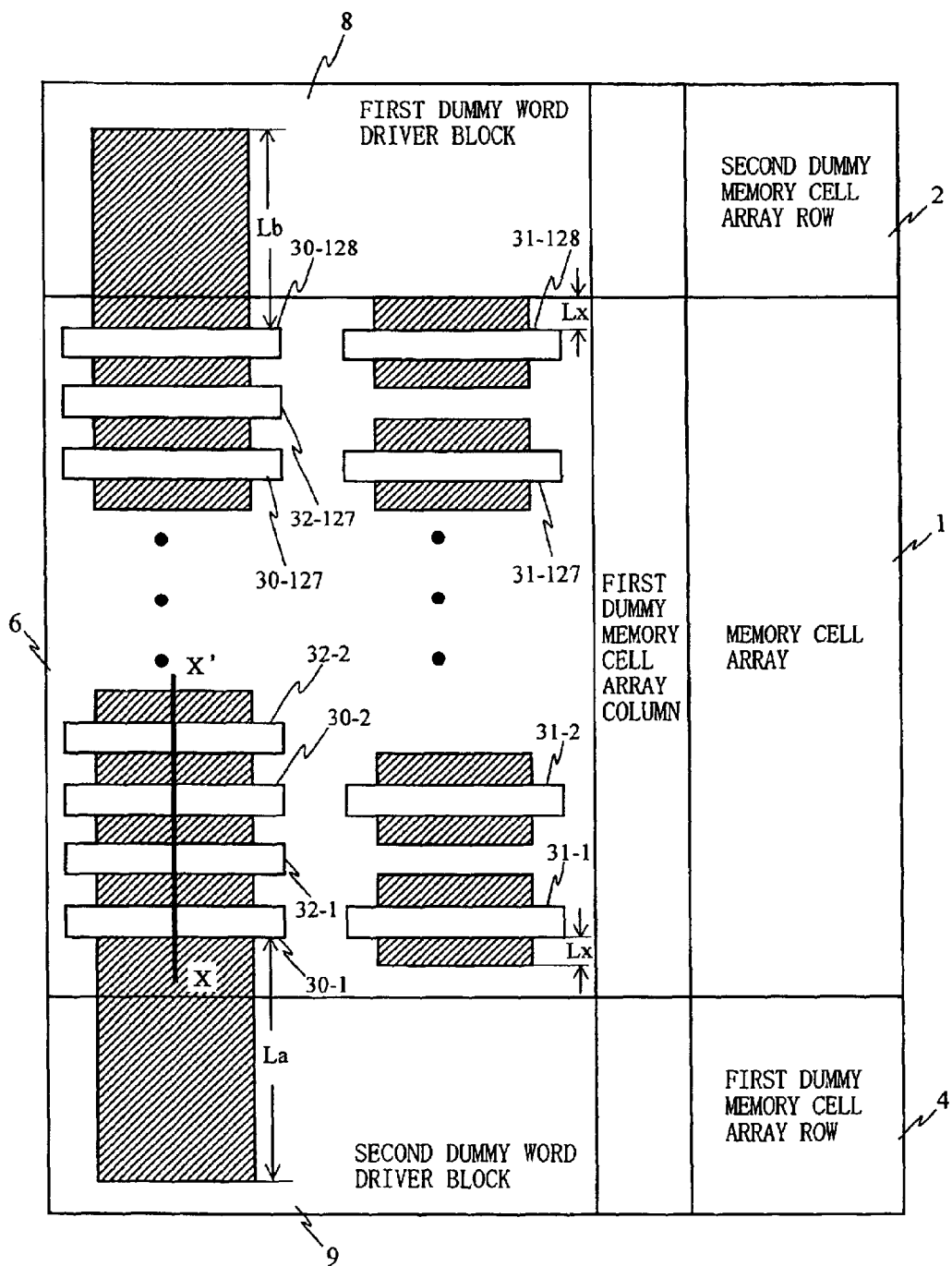
FIG. 3 is an illustration showing an arrangement of transistors in the word driver block.

The word driver block 6 having the above-described circuitry configuration has incorporated therein transistors arranged in a manner as described below with reference to FIG. 3. FIG. 3 is an illustration showing an arrangement of the N-ch MOS transistors 30-$k$ and 32-$j$ and the P-ch MOS transistors 31-$k$. In FIG. 3, hollow rectangular portions each represent a gate electrode of the relevant transistor, while hatched rectangular portions each represent a diffusion layer.

First, in the word driver block 6 shown in FIG. 3, the P-ch MOS transistors 31-$k$ arranged at the right column are described. The P-ch MOS transistors 31-$k$ are arranged in the height direction with the longitudinal direction of each gate electrode being oriented in the width direction. Also, the P-ch MOS transistors 31-$k$ are arranged at a spacing equal to that of the memory cells MC arranged in the memory cell array 1 in the height direction.

Similarly, the N-ch MOS transistors 30-$k$ each forming a CMOS inverter are arranged in the height direction with the longitudinal direction of each gate electrode being oriented in the width direction. Also, the P-ch MOS transistors 30-$k$ are arranged at a spacing equal to that of the memory cells MC arranged in the memory cell array 1 in the height direction. As shown in FIG. 3, two adjacent-arranged N-ch MOS transistors 30-$k$ are provided therebetween with one N-ch MOS transistor 32-$j$ with its diffusion layers shared with these adjacent N-ch MOS transistors 30-$k$.

Figure 4:
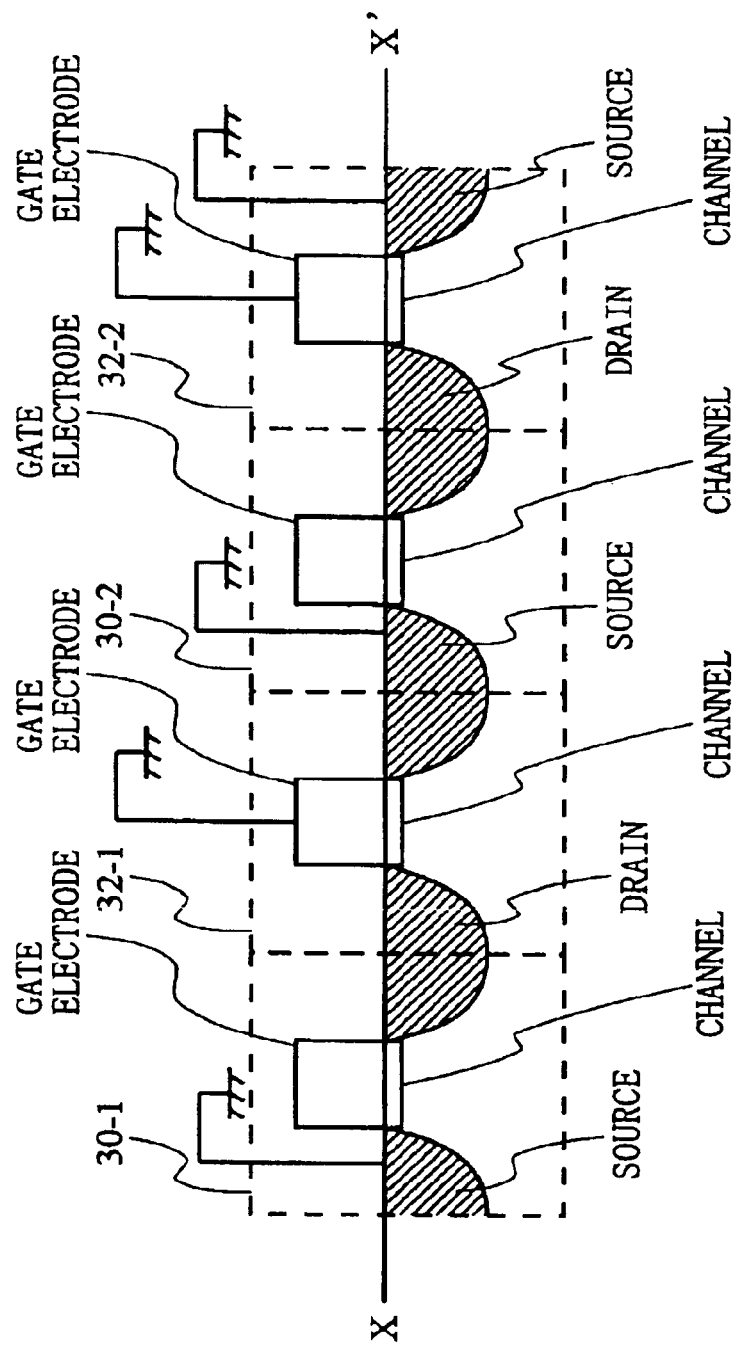
FIG. 4 is a section view showing a configuration of N-ch MOS transistors in the word driver block.

FIG. 4 is a section view of the arrangement at a line X–X' shown in FIG. 3. With reference to FIG. 4, the relation between the N-ch MOS transistors 30-$k$ and the N-ch MOS transistors 32-$j$ is described below. As shown in FIG. 4, the N-ch MOS transistors 30-$k$ each forming a CMOS inverter and the unoperable N-ch MOS transistors 32-$j$ are alternately arranged. Of the N-ch MOS transistors 30-$k$ and 32-$j$, those adjacent to each other share a diffusion layer (source or drain). The source of each N-ch MOS transistor 30-$k$ is grounded, and so is the gate electrode of each unoperable N-ch MOS transistor 32-$j$. This corresponds to the fact that the source and the gate of each unoperable N-ch MOS transistor 32-$j$ are grounded. As such, with adjacent N-ch MOS transistors 30-$k$ being provided therebetween with one N-ch MOS transistor 32-$j$ with its source and gate grounded, it is possible to prevent an electric current from flowing through the adjacent N-ch MOS transistors 30-$k$. Therefore, the adjacent N-ch MOS transistors 30-$k$ can be electrically insulated from each other without performing isolation through STI.

As shown in FIG. 3, the source of the diffusion layer of the N-ch MOS transistor 30-1 extends to as far as the inside of the second dummy word driver block 9. Similarly, the drain of the diffusion layer of the N-ch MOS transistor 30-128 extends to as far as the inside of the first dummy word driver block 8. Therefore, a distance La from the gate electrode of the N-ch MOS transistor 30-1 located at one end of the word driver block 6 to an end of the relevant diffusion layer and a distance Lb from the gate electrode of the N-ch MOS transistor 30-128 located at the other end thereof to an end of the relevant diffusion layer are both longer than the length of each diffusion layer of any other N-ch MOS transistors 30-2 through 30-127. Therefore, even when an insulator film is formed through STI at the side of the diffusion layer of each of the N-ch MOS transistors 30-1 and 30-128, these N-ch MOS transistors 30-1 and 30-128 do not suffer from the influence of defects caused by stress occurring at the interface between the diffusion layer and the STI insulator film.

Note that the distance La from the gate electrode to the end of the diffusion layer of the N-ch MOS transistor 30-1 shown in FIG. 3 is longer than at least a distance Lx from the gate electrode to the end of the diffusion layer of the adjacent P-ch MOS transistor 31-1. Also, the distance Lb from the gate electrode to the end of the diffusion layer of the N-ch MOS transistor 30-128 is longer than at least the distance Lx from the gate electrode to the end of the diffusion layer of the adjacent P-ch MOS transistor 31-128.

Figure 5:
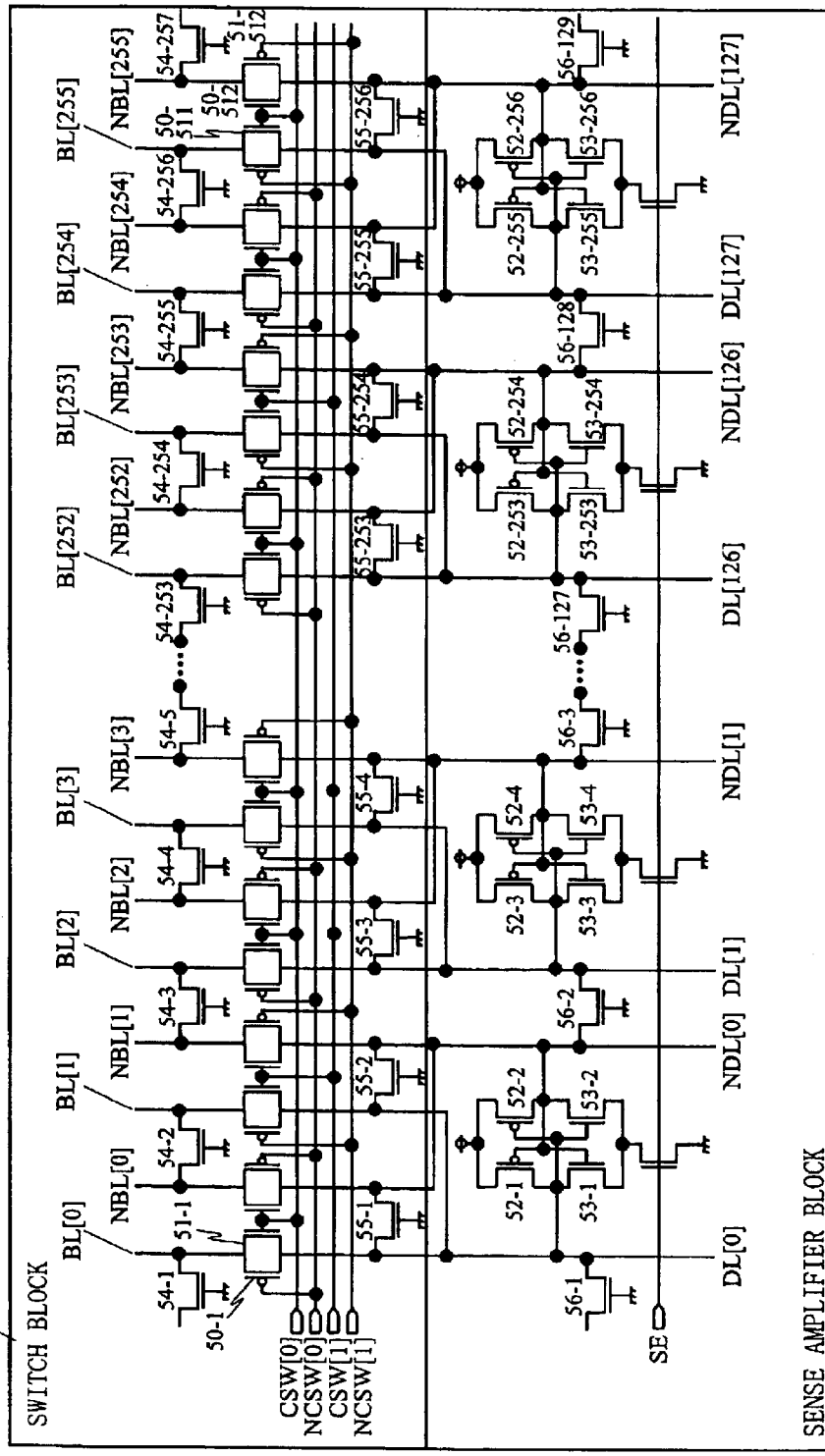
FIG. 5 is an illustration showing a circuitry configuration of a switch block and a sense amplifier block of the semiconductor memory device according to the present invention.
Figure 6:
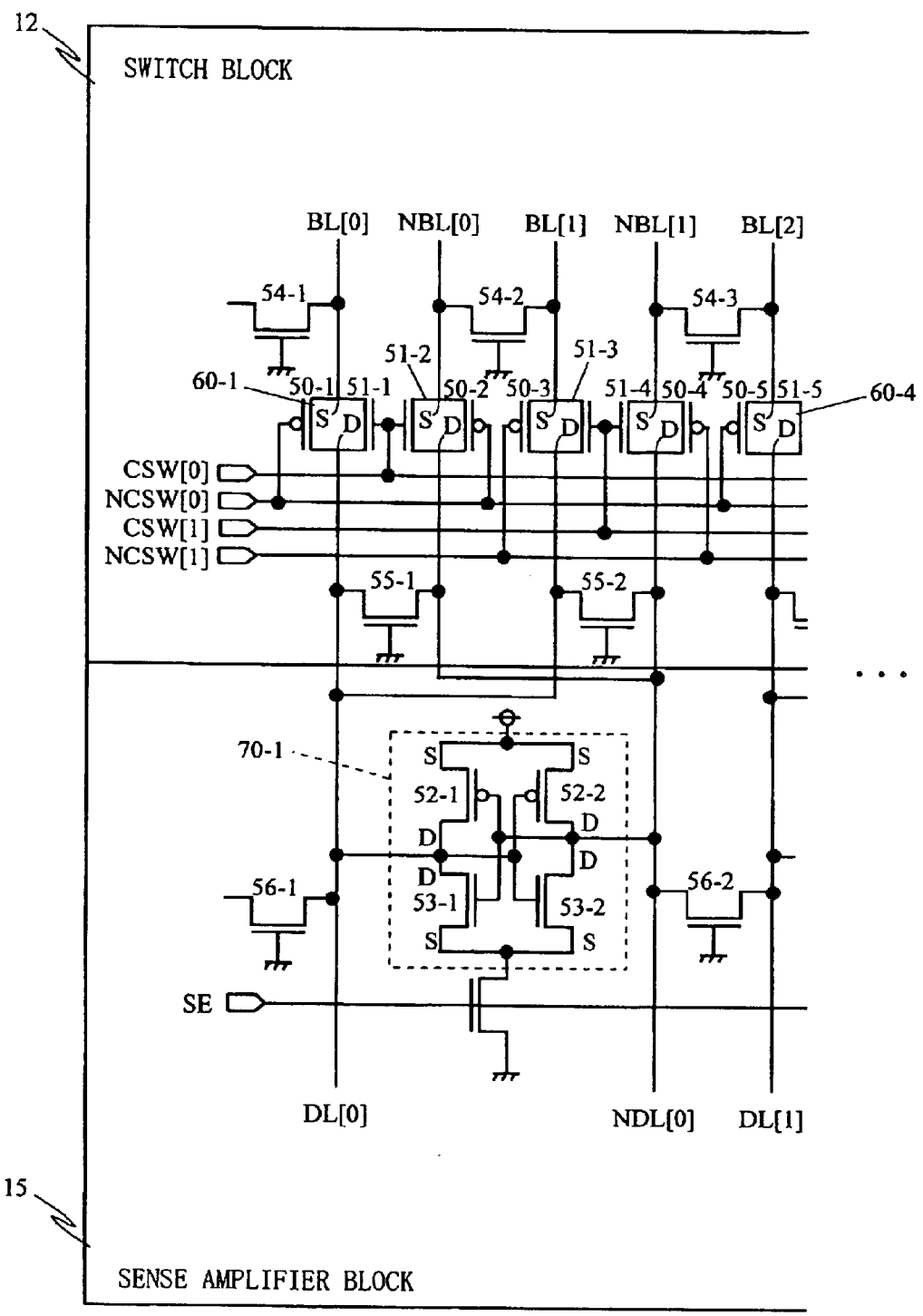
FIG. 6 is an enlarged view of a circuitry configuration of the switch block and the sense amplifier block.

Next, the switch block 12 and the sense amplifier block 15 are described below. FIG. 5 is an illustration showing a circuitry configuration of the switch block 12 and the sense amplifier block 15. FIG. 6 is an enlarged view of a part of the switch block 12 and the sense amplifier block 15. Note that, for the purpose of easy viewing, some of the reference numerals provided to the transistors are omitted.

Also as shown in FIG. 1, the switch block 12 is provided at the lower side of the memory cell array 1. Furthermore, the sense amplifier block 15 is provided at the lower side of the switch block 12. The switch block 12 transfers only the data of a bit line BL[f] selected from bit lines BL[f] of the memory cells MC of the memory cell array 1 from which data has been read. Also, the sense amplifier block 15 amplifies a data signal transferred from the switch block 12, and then transfers the amplified data signal to an output circuit.

As shown in FIGS. 5 and 6, the switch block 12 is provided with the bit lines BL[f] and the inverted bit lines NBL[f], switch selection signal lines CSW[0] and CSW[1], and inverted switch selection signal lines NCSW[0] and NCSW[1]. Also, the switch block 12 includes the 512 P-ch MOS transistor 50-$n$ and the 512 N-ch MOS transistor 51-$n$, 257 N-ch MOS transistors 54-$i$ ($i$ is an integer from 1 to 257), and 256 N-ch MOS transistors 55-$h$ ($h$ is an integer from 1 to 256).

Note that the circuits of the switch block 12 and the sense amplifier block 15 are configured so that the circuitry configuration sandwiched between the bit line BL[0] and the inverted bit line NBL[1] is repeated 128 times. Therefore, hereinafter, description is made mainly to the portion sandwiched between the bit line BL[0] and the inverted bit line NBL[1].

As shown in FIG. 6, the source of the P-ch MOS transistor 50-1 and the source of the N-ch MOS transistor 51-1 are connected to the bit line BL[0]. Also, the drain of the P-ch MOS transistor 50-1 and the drain of the N-ch MOS transistor 51-1 are connected to the data line DL[0]. The gate of the P-ch MOS transistor 50-1 is connected to the inverted switch selection signal line NCSW[0], while the gate of the N-ch MOS transistor 51-1 is connected to the switch selection signal line CSW[0].

Also, the source of the P-ch MOS transistor 50-2 and the source of the N-ch MOS transistor 51-2 are connected to the inverted bit line NBL[0]. Still further, the drain of the P-ch MOS transistor 50-2 and the drain of the N-ch MOS transistor 51-2 are connected to the inverted data line NDL[0]. The gate of the P-ch MOS transistor 50-2 is connected to the inverted switch selection signal line NCSW [0], while the gate of the N-ch MOS transistor 51-2 is connected to the switch selection signal line CSW[0].

Furthermore, the source of the P-ch MOS transistor 50-3 and the source of the N-ch MOS transistor 51-3 are connected to the bit line BL[1]. The drain of the P-ch MOS transistor 50-3 and the drain of the N-ch MOS transistor 51-3 are connected to the data line DL[0]. Still further, the gate of the P-ch MOS transistor 50-3 is connected to the inverted switch selection signal line NCSW[1], while the gate of the N-ch MOS transistor 51-3 is connected to the switch selection signal line CSW[1].

Still further, the source of the P-ch MOS transistor 50-4 and the source of the N-ch MOS transistor 51-4 are connected to the inverted bit line NBL[1]. The drain of the P-ch MOS transistor 50-4 and the drain of the N-ch MOS transistor 51-4 are connected to the inverted data line NDL[0]. Still further, the gate of the N-ch MOS transistor 51-4 is connected to the switch selection signal line CSW[1], while the gate of the P-ch MOS transistor 50-4 is connected to the inverted switch selection signal line NCSW[1].

Still further, as shown in FIGS. 5 and 6, the sense amplifier block 15 is provided with data lines DL[p] (p is an integer from 0 to 127), inverted data lines NDL[p], and a sense amplifier active signal line SE. Also, the sense amplifier block 15 includes 256 P-ch MOS transistors 52-$m$ (m is an integer from 1 to 256), 256 N-ch MOS transistors 53-$m$, and 129 N-ch MOS transistors 56-$j$ (j is an integer from 1 to 129). Two P-ch MOS transistors 52-$m$ and two N-ch MOS transistors 53-$m$ form a sense amplifier 70-$r$ (r is an integer from 1 to 128). Specifically, the P-ch MOS transistors 52-1 and 52-2 and the N-ch MOS transistors 53-1 and 53-2 shown in FIG. 6 form a sense amplifier 70-1.

As shown in FIG. 6, the source of the P-ch MOS transistor 52-1 and the source of the P-ch MOS transistor 52-2 are connected to each other, while the source of the N-ch MOS transistor 53-1 and the source of the N-ch MOS transistor 53-2 are connected to each other. The gate of the P-ch MOS transistor 52-1, the gate of the N-ch MOS transistor 53-1, the drain of the P-ch MOS transistor 52-2, and the drain of the N-ch MOS transistor 53-2 are connected to the inverted data line NDL[0]. On the other hand, the drain of the P-ch MOS transistor 52-1, the drain of the N-ch MOS transistor 53-1, the gate of the P-ch MOS transistor 52-2, and the gate of the N-ch MOS transistor 53-2 are connected to the data line DL[0].

Figure 17:
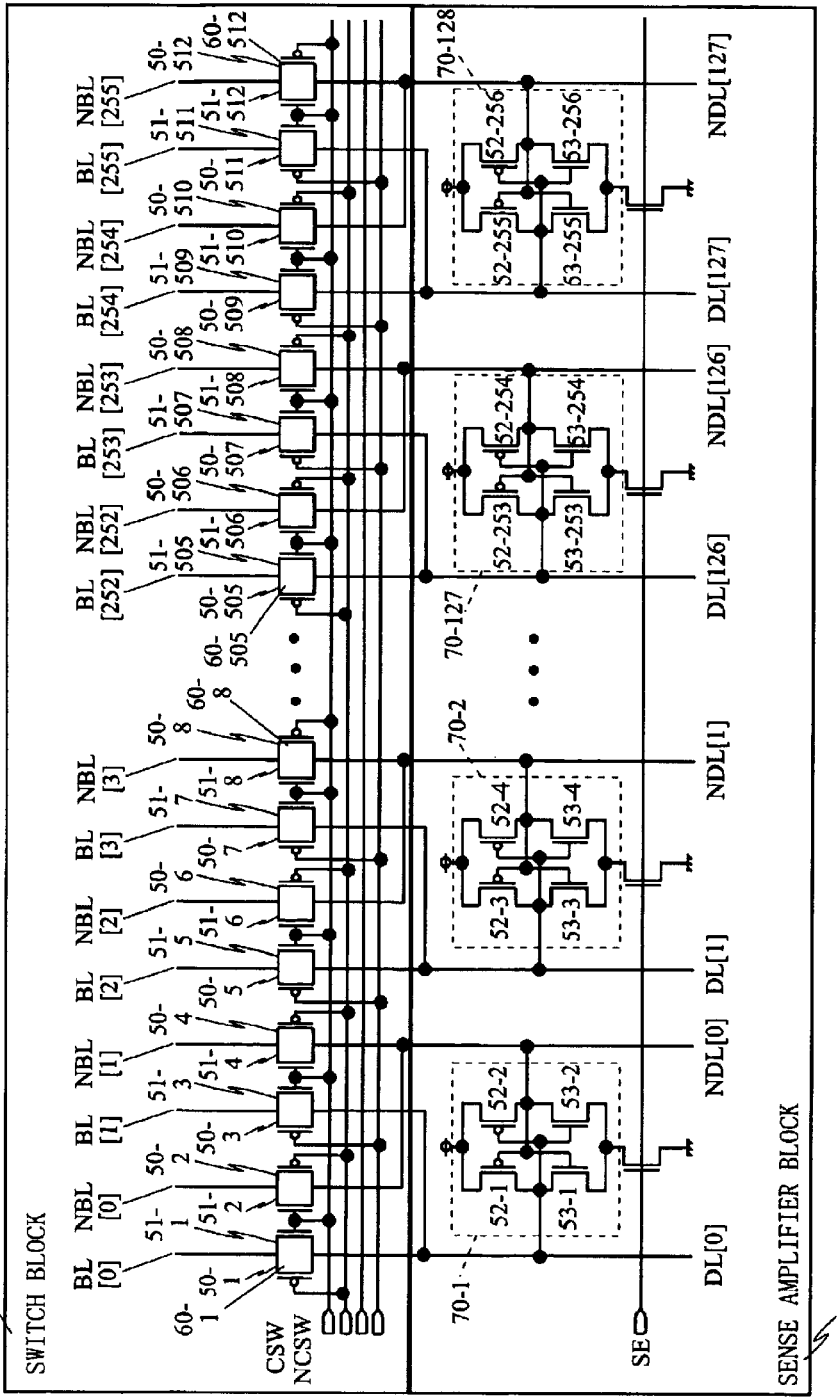
FIG. 17 is an illustration showing a circuitry configuration of a conventional switch block and a conventional sense amplifier block.
Figure 18:
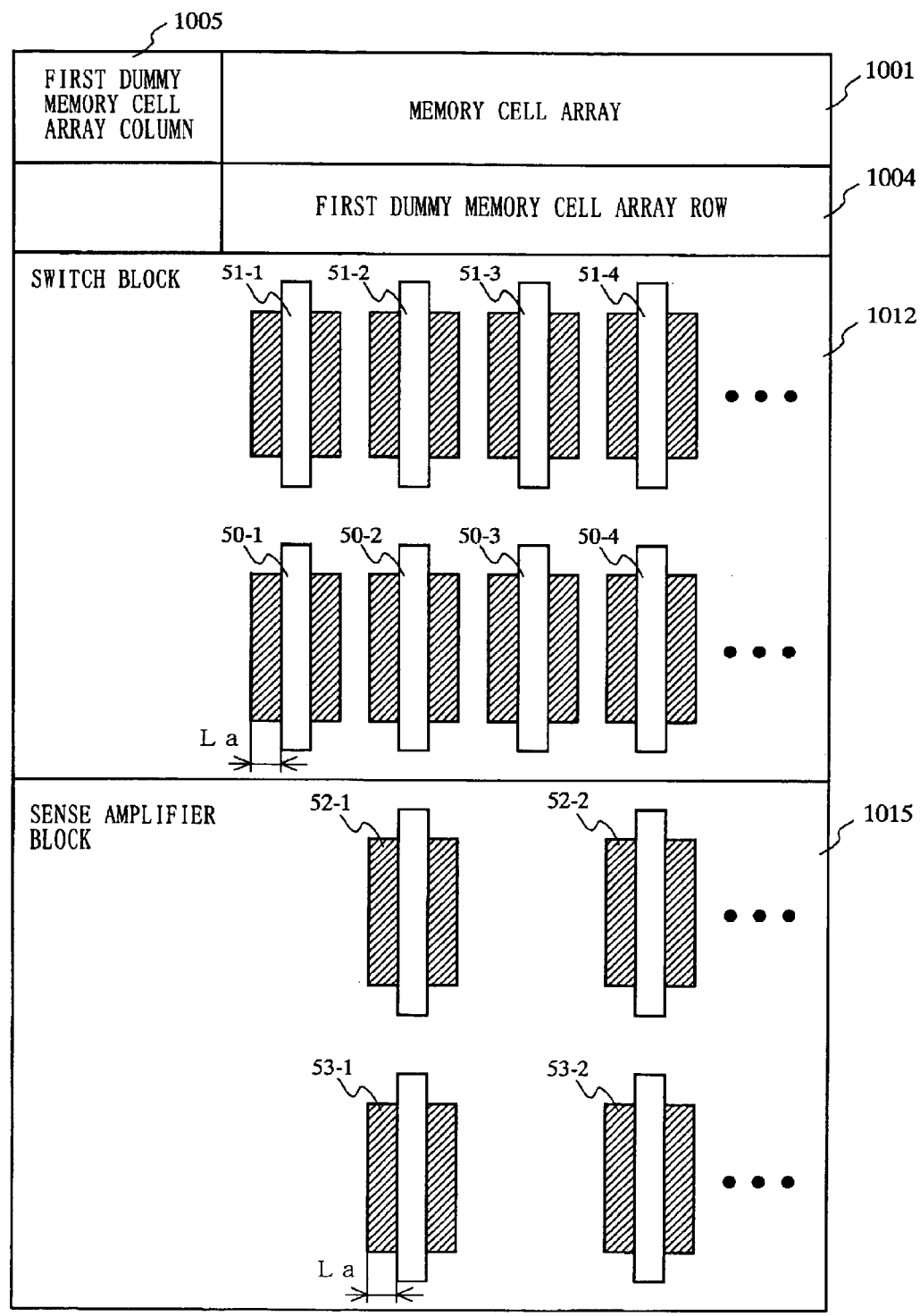
FIG. 18 is an illustration showing an arrangement of transistors in the conventional switch block and the conventional sense amplifier block.

The switch block 12 and the sense amplifier block 15 in the semiconductor device according to the present embodiment shown in FIGS. 5 and 6 are different from the switch block 1012 and the sense amplifier block 1015 in the conventional semiconductor device shown in FIG. 17 in the following points. First, the switch block 12 according to the present invention is provided with, as shown in FIG. 6, the N-ch MOS transistors 54-$i$ each connecting the sources of the adjacent N-ch MOS transistors 51-$n$ together, and the N-ch MOS transistors 55-$h$ each connecting the drains of the adjacent N-ch MOS transistors 51-$n$. Also, the sense amplifier block 15 is provided with, as shown in FIG. 6, the N-ch MOS transistors 56-$j$ each connecting a data line DL[p] and an inverted data line NDL that are adjacent to each other.

Here, description is made to the connection of the N-ch MOS transistors 54-$i$, 55-$h$, and 56-$j$, which is a feature of the present embodiment. The source of the N-ch MOS transistor 51-1 is connected to a diffusion layer of the N-ch MOS transistor 54-1. The source of the N-ch MOS transistor 51-2 and the source of the N-ch MOS transistor 51-3 are connected to diffusion layers of the N-ch MOS transistor 54-2. Also, the source of the N-ch MOS transistor 51-4 and the source of the N-ch MOS transistor 51-5 are connected to diffusion layers of the N-ch MOS transistor 54-3. The gate of the N-ch MOS transistors 54-$i$ is grounded.

Also, the drain of the N-ch MOS transistor 51-1 and the drain of the N-ch MOS transistor 51-2 are connected to the diffusion layers of the N-ch MOS transistor 55-1. Furthermore, the drain of the N-ch MOS transistor 51-3 and the drain of the N-ch MOS transistor 51-4 are connected to the diffusion layers of the N-ch MOS transistor 55-2. The gate of each N-ch MOS transistor 55 is grounded. This prevents an electric current from flowing through the adjacent N-ch MOS transistors 51-$n$.

Furthermore, the data line DL[0] is connected to a diffusion layer of the N-ch MOS transistor 56-1, and the inverted data line NDL[0] and the data line DL[1] are connected to diffusion layers of the N-ch MOS transistor 56-2. The gate of the N-ch MOS transistor 56-1 and the gate of the N-ch MOS transistor 56-2 are grounded. This prevents an electric current from flowing through a data line DL[p] and an inverted data line NDL[p] that are adjacent to each other.

Figure 7:
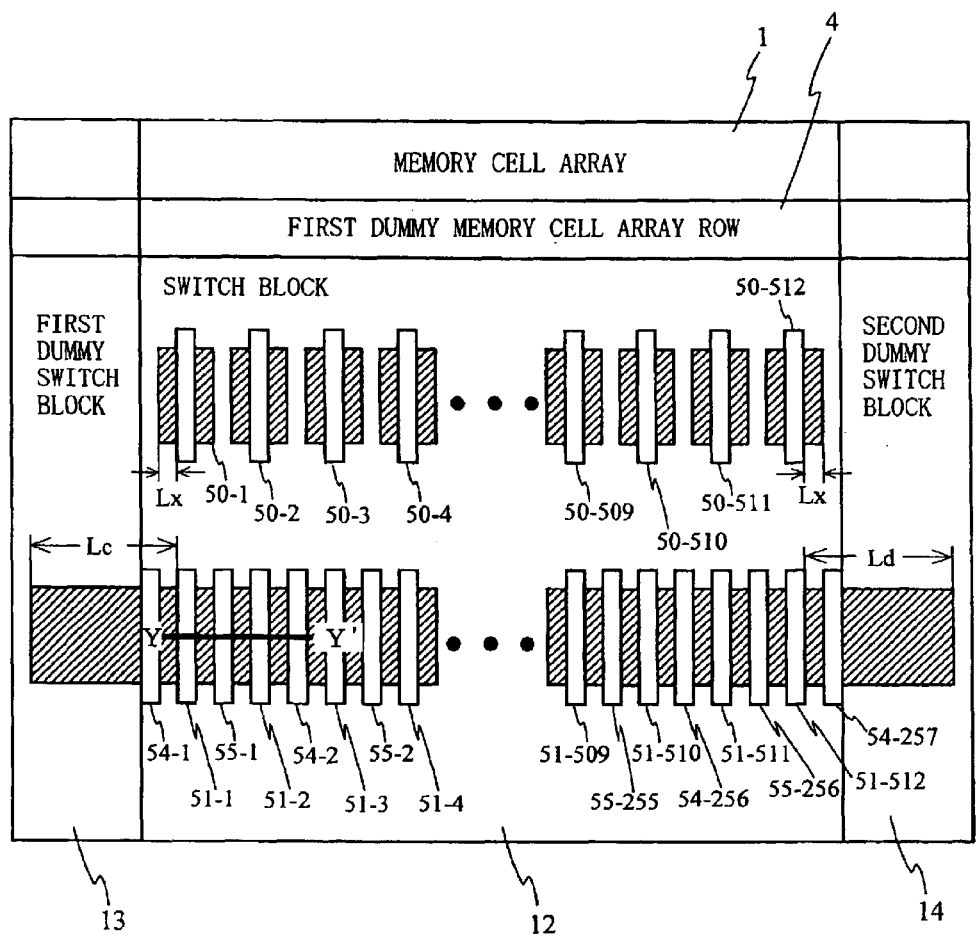
FIG. 7 is an illustration showing an arrangement of transistors in the switch block.
Figure 8:
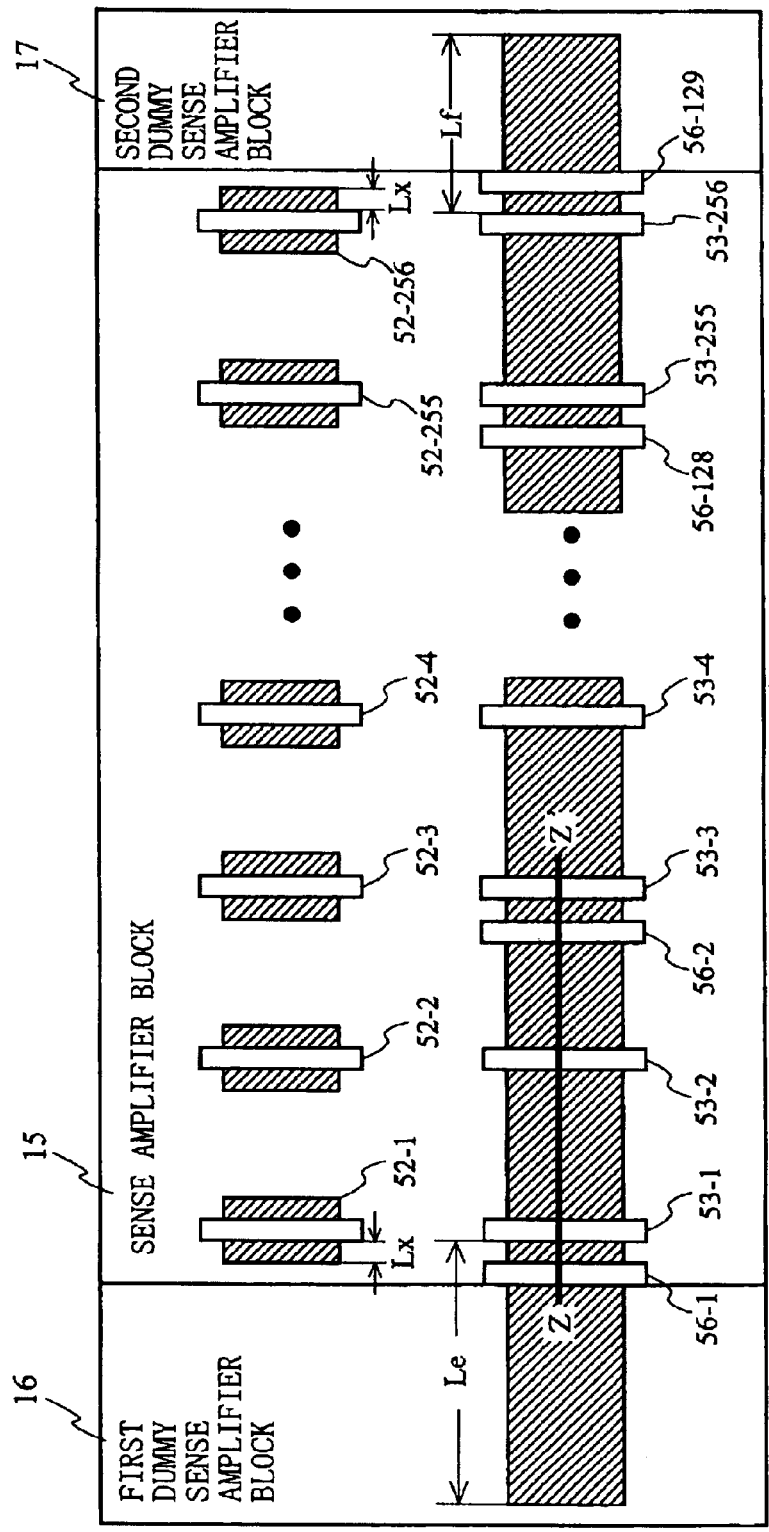
FIG. 8 is an illustration showing an arrangement of transistors in the sense amplifier block.
Figure 9:
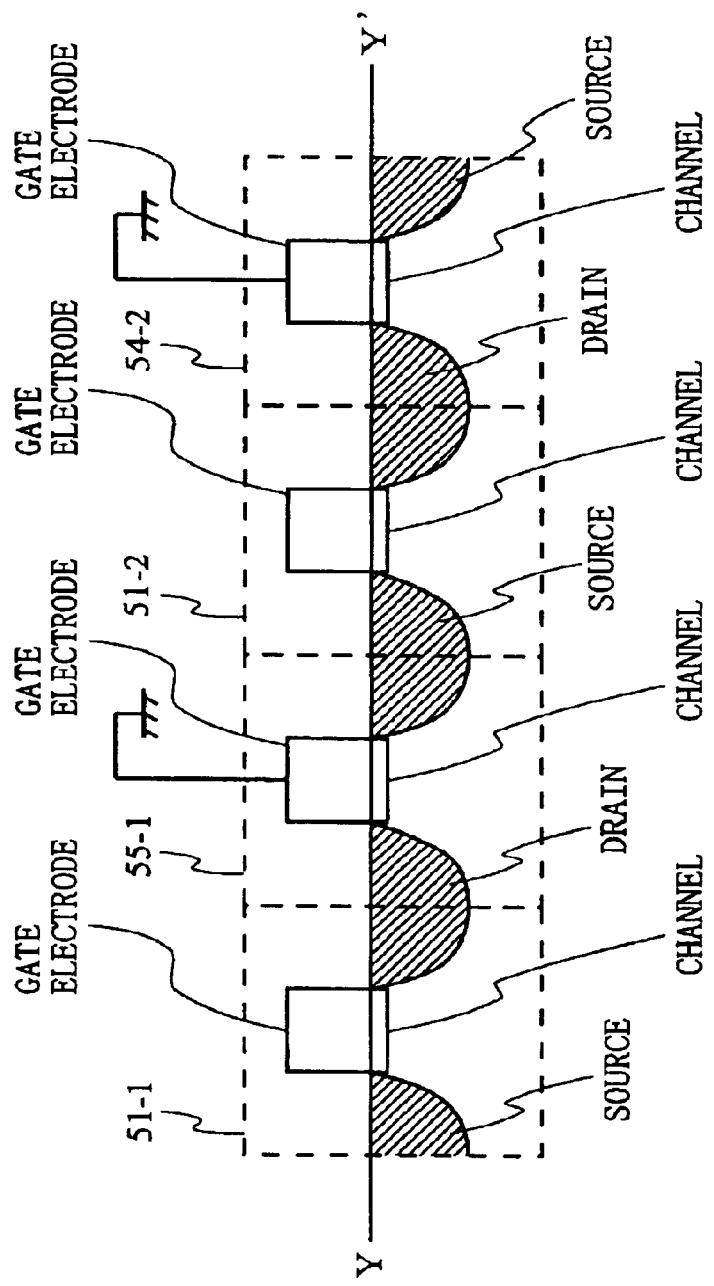
FIG. 9 is a section view showing a configuration of N-ch MOS transistors in the switch block.

Next, with reference to FIGS. 7, 8 and 9, the arrangement of the transistors in the switch block 12 and the sense amplifier block 15 shown in FIGS. 5 and 6 is described. FIG. 7 is an illustration showing the arrangement of the transistors in the switch block 12. FIG. 8 is an illustration showing the arrangement of the transistors in the sense amplifier block 15. Note that hollow rectangular portions each represent a gate electrode, while hatched rectangular portions each represent a diffusion layer.

As shown in FIG. 7, the P-ch MOS transistors 50-$n$ are arranged on an upper portion of the switch block 12 in the width direction with a longitudinal direction of each gate electrode being oriented to the height direction. The P-ch MOS transistors 50-$n$ are arranged at a spacing equal to that of the memory cells MC arranged in the memory cell array 1 in the width direction.

Similarly, the N-ch MOS transistors 51-$n$ are arranged on a lower portion of the switch block 12 in the width direction with a longitudinal direction of each gate electrode being oriented to the height direction. The N-ch MOS transistors 51-$n$ are also arranged at a spacing equal to that of the memory cells MC arranged in the memory cell array 1 in the width direction. Furthermore, the N-ch MOS transistor 54-1 is provided at the left of the N-ch MOS transistor 51-1. Between the adjacent N-ch MOS transistors 51-$n$, the N-ch MOS transistor 54-$i$ or the N-ch MOS transistor 55-$h$ is provided. Specifically, the transistors are arranged in the order of, from left, the N-ch MOS transistor 51-1, the N-ch MOS transistor 55-1, the N-ch MOS transistor 51-2, and then N-ch MOS transistor 54-2. This set of arrangement is periodically repeated.

FIG. 9 is a section view of the arrangement at a line Y–Y' shown in FIG. 7. As shown in FIG. 9, the transistors are arranged in the order of the N-ch MOS transistor 51-1 connected to a bit line, the unoperable N-ch MOS transistor 55-1, the N-ch MOS transistor 51-2 connected to an inverted bit line, and then the unoperable N-ch MOS transistor 54-2. Each of the N-ch MOS transistors 51-1, 55-1, 51-2, and 54-2 shares a diffusion layer (source or drain) of its adjacent N-ch MOS transistor. Furthermore, the gate electrodes of the N-ch MOS transistors 55-1 and 54-2 are grounded. This corresponds to the fact that the N-ch MOS transistors 54-$i$ and 55-$h$ are grounded so as not to operate. As such, with the unoperable N-ch MOS transistor 54-$i$ or 55-$h$ being provided between adjacent N-ch MOS transistors 51-$n$, the N-ch MOS transistors 51-$n$ can be electrically insulated without performing isolation through STI.

As shown in FIG. 7, the diffusion layer (source) of the N-ch MOS transistor 54-1 located at the left extends to as far as the inside of the first dummy switch block 13. Similarly, the diffusion layer (drain) of the N-ch MOS transistor 54-257 located at the right extends to as far as the inside of the second dummy switch block 14. As such, a distance Lc from the gate electrode of the N-ch MOS transistor 51-1 to an end of the diffusion layer located at the left end and a distance Ld from the gate electrode of the N-ch MOS transistor 51-512 to an end of the diffusion layer located at the right end are made long. This prevents the N-ch MOS transistors 51-1 and 51-512 from suffering from defects caused by stress occurring at the interface between the diffusion layer and the STI insulator film.

Next, with reference to FIG. 8, the arrangement of the transistors in the sense amplifier block 15 is described. The P-ch MOS transistors 52-$m$ are arranged on an upper portion of the sense amplifier block 15 in the width direction with a longitudinal direction of each gate electrode being oriented to the height direction. The P-ch MOS transistors 52-$m$ are arranged at a spacing depending on that of the memory cells arranged in the memory cell array 1.

Here, the number of P-ch MOS transistors 52-$m$ included in the sense amplifier block 15 is 256, which is half of the number of P-ch MOS transistors 50-$n$ included in the switch block 12. One P-ch MOS transistor 52-$m$ is provided below every other P-ch MOS transistor 50-$n$ in the switch block 12. Also, the N-ch MOS transistors 53-$m$ are arranged on a lower portion of the sense amplifier block 15 in the width direction with a longitudinal direction of each gate electrode being oriented to the height direction. The N-ch MOS transistors 53-$m$ are arranged at a spacing depending on that of the memory cells arranged in the memory cell array 1. Furthermore, of the N-ch MOS transistors 53-$m$, the N-ch MOS transistors 53-$m$ where m is an odd number are each provided at its left with one N-ch MOS transistor 56-$j$. Still further, the N-ch MOS transistor 53-256 at the right end is provided at its right with the N-ch MOS transistor 56-129.

Here, with reference to FIG. 10, the relation between the N-ch MOS transistors 53-$m$ and 56-$j$ is described below.

Figure 10:
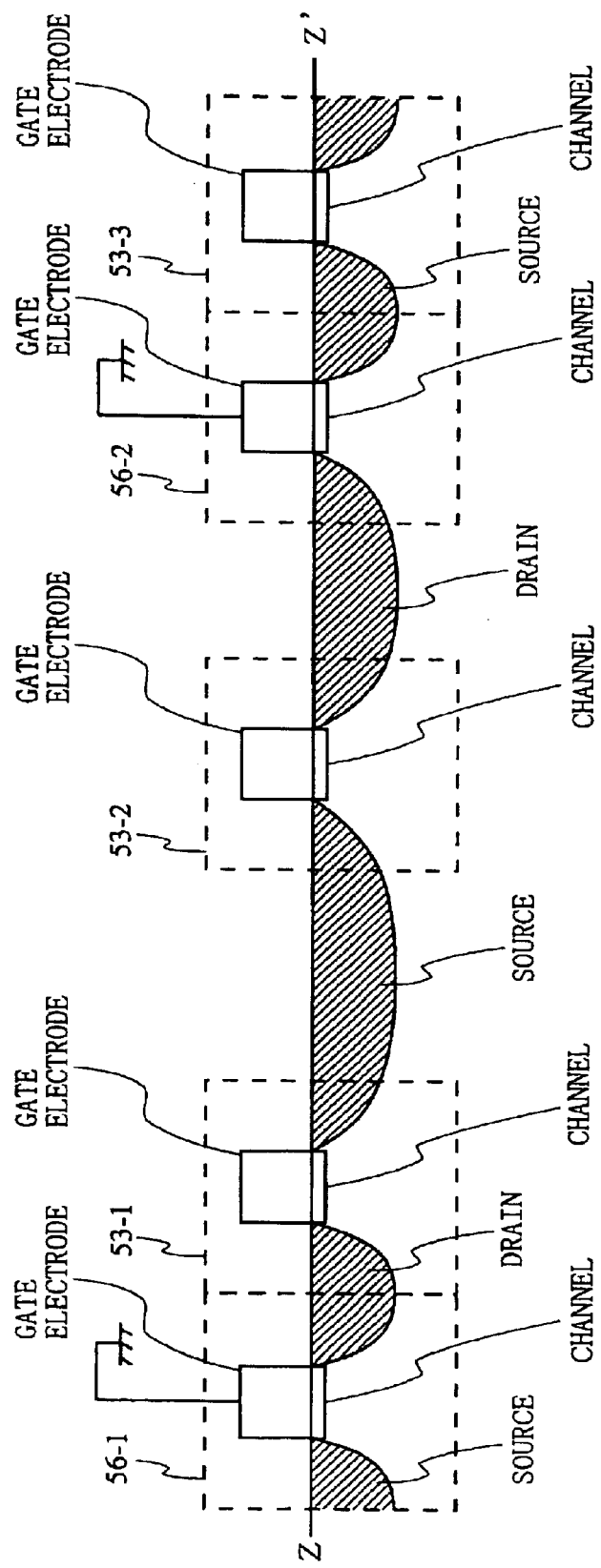
FIG. 10 is a section view showing a configuration of N-ch MOS transistors in the sense amplifier block.

FIG. 10 is a section view of the arrangement at a line Z–Z' shown in FIG. 8. As shown in FIG. 10, the unoperable N-ch MOS transistor 56-2 is placed between the N-ch MOS transistor 53-2 and the N-ch MOS transistor 53-3 forming different sense amplifiers. Note that no unoperable N-ch MOS transistor 56-$j$ is placed between the N-ch MOS transistor 53-1 and the N-ch MOS transistor 53-2 forming a sense amplifier. As shown in FIG. 10, each of the N-ch MOS transistors 53-$m$ and 56-$j$ shares the diffusion layer (source or drain) of its adjacent N-ch MOS transistor. Furthermore, the gate electrode of each of the N-ch MOS transistor 56-$j$ is grounded. This corresponds to the fact shown in FIG. 6 that the gate of each of the N-ch MOS transistors 56-$j$ is grounded so as not to operate. As such, the unoperable N-ch MOS transistors 56-$j$ are provided only to a part of the portions between the adjacent N-ch MOS transistors 53-$m$. This makes it possible to isolate the N-ch MOS transistors 53-$m$ to be insulated without performing isolation through STI.

Also, as shown in FIG. 8, a diffusion layer (source) of the N-ch MOS transistor 56-1 located at the left end extends to as far as the inside of the first dummy sense amplifier block 16. Similarly, a diffusion layer (drain) of the N-ch MOS transistor 56-129 located at the right end extends to as far as the inside of the second dummy sense amplifier block 17. As such, a distance Le from the gate electrode of the N-ch MOS transistor 53-1 to the left end of the diffusion layer located at the left end and a distance Lf from the gate electrode of the N-ch MOS transistor 53-256 to right end of the diffusion layer located at the right end are made long. This prevents the N-ch MOS transistors 53-1 and 53-256 from suffering from defects caused by stress occurring at the interface between the diffusion layer and the STI insulator film.

Next, the operation of the above-configured semiconductor memory device is described below. Here, description is made to the case in which a memory cell MC in the memory cell array 1 shown in FIG. 14 is selected, and then data is read from the selected memory cell MC. More specifically, description is made to an exemplary case in which data is read from a memory cell MC connected to both of the word line WL[0] and the bit line BL[0].

First, when the word line WL[0] is selected, in FIG. 2, the row decode signals RAD1[0] and RAD2[0] in the row decoder block 7 are selected through an address input. Specifically, the row decode signals RAD1[0] and RAD2[0] becomes a High level. In response, an output of the NAND circuit 20-1 to which the row decode signals RAD1[0] and RAD2[0] are coupled becomes a Low level. This causes an output to the CMOS inverter connected to the NAND circuit 20-1 to be at a Low level. That is, the gate electrode of each of the N-ch MOS transistor 30-1 and the P-ch MOS transistor 31-1 forming the CMOS inverter becomes a Low level. With the input at Low level, the CMOS inverter outputs a signal at a High-level potential signal at a of to the connected word line WL[0]. Thus, the word line WL[0] is selected, and then the memory cells MC connected to that word line WL[0] are selected. Then, signals are read from the selected memory cells MC to the bit line BL[f].

When the signals are read to the bitline BL[f], in FIG. 6, an address input is supplied, thereby selecting the column switch selection signal line CSW[0] and the inverted column switch selection signal line NCSW[0]. Specifically, the switch selection signal line CSW[0] becomes a High level, while the inverted switch selection signal line NCSW[0] becomes a Low level. In response, the P-ch MOS transistor 50-1 and the N-ch MOS transistor 51-1 coupling the bit line BL[0] to the switch selection signal line CSW[0] and the inverted switch selection signal line NCSW[0] switches to an On state. Furthermore, the P-ch MOS transistor 50-2 and the N-ch MOS transistor 51-2 coupling the inverted bit line NBL[0] to the switch selection signal line CSW[0] and the inverted switch selection signal line NCSW[0] switches to an On state. With this, the data read to the bit line BL[0] is transferred via the P-ch MOS transistor 50-1 and the N-ch MOS transistor 51-1 to the data line DL[0]. Similarly, the data read to the inverted bit line NBL[0] is transferred via the P-ch MOS transistor 50-2 and the N-ch MOS transistor 51-2 to the data line NDL[0].

Next, a sense amplifier active signal SE is made High. In response, the sense amplifier formed by the P-ch MOS transistors 52-1 and 52-2 and the N-ch MOS transistors 53-1 and 53-2 compares a subtle potential difference between the data line DL[0] and the inverted data line NDL[0], and then further amplifies the potential difference. Then, the sense amplifier outputs the amplified potential difference to an external circuit not shown. With this, the data is read from the memory cell MC.

As has been described in the foregoing, according to the semiconductor memory device of the present embodiment, N-ch MOS transistors can be electrically isolated without performing isolation through STI. Therefore, it is possible to design the N-ch MOS transistors and their arrangement with minimum or approximately minimum values in design rules. As a result, the semiconductor memory device can be made compact. Also, the N-ch MOS transistors can be easily arranged at a spacing equal to that of the memory cells. These effects are specifically described below.

When N-ch MOS transistors are isolated through STI, a stress occurs between the insulator film and the diffusion layer to cause a large amount of defects. Such defects decreases an electric current flowing through the N-ch MOS transistors. Moreover, as the distance from an end of the gate electrode to an end of the diffusion layer is shorter, the electric current is decreased significantly.

On the other hand, according to the semiconductor memory device of the present embodiment, adjacent N-ch MOS transistors are provided therebetween with an N-ch MOS transistor with its gate being grounded, and this N-ch MOS transistor shares the diffusion layers with these adjacent N-ch MOS transistors. Therefore, the N-ch MOS transistors can be electrically isolated without performing isolation through STI. As a result, it is possible to design the N-ch MOS transistors and their spacing with minimum or approximately minimum values in the design rules without considering adverse effects of STI on the N-ch MOS transistors.

Also, since the N-ch MOS transistors can be designed with minimum or approximately minimum values in the design rules, the N-ch MOS transistors can be easily arranged correspondingly to the spacing of the memory cells. This makes it easy to design the circuit of the semiconductor memory device.

Also, as the distance from the end of the gate electrode to the end of the diffusion layer is decreased, the electric current is increased in the P-ch MOS transistors. Therefore, by designing the P-ch MOS transistors with as minimum or approximately minimum values in the design rules as possible and isolating the diffusion layers of the adjacent P-ch MOS transistors through STI, it is possible to improve the characteristics of the P-ch MOS transistors.

Furthermore, according to the semiconductor memory device of the present embodiment, the diffusion layer of the N-ch MOS transistor located at each end is made long. Therefore, the distance from the end of the gate electrode of the N-ch MOS transistor to the end of the diffusion layer can be increased, thereby increasing the electric current flowing through the N-ch MOS transistor. This is specifically described below.

Regarding the N-ch MOS transistors 30-1 and 30-128 located at the ends of the word driver block 6, the N-ch MOS transistors 51-1 and 51-512 located at the ends of the switch block 12, and the N-ch MOS transistors 53-1 and 53-256 located at the ends of the sense amplifier block 15, if the distances La through Lf from the end of the relevant gate electrode to the end of the relevant diffusion layer each have its minimum or approximately minimum value in the design rules, only the transistor characteristics of these N-ch MOS transistors are changed, thereby decreasing the electric current. This leads to a delay in a trailing time of the signal on a word line or a bit line connected to either one of the above-mentioned N-ch MOS transistors compared with a trailing time of a signal on another word line or bit line.

On the other hand, in the semiconductor device according to the present embodiment, the diffusion layer of the N-ch MOS transistor located at each end of the switch block, for example, is extended. As a result, the distance La from the end of the gate electrode to the end of the diffusion layer can be increased, thereby increasing the electric current flowing through the N-ch MOS transistor. That is, a leading time of the signal on the word line or the bit line connected to the N-ch MOS transistor can be made equal to that of the signal on another word line or bit line. This can improve the capability of the entire memory.

Note that, in a memory cell area, it is desirable that unoperable dummy memory cells be arranged outside of operable normal memory cells. With such dummy memory cells being arranged outside of operable memory cells, it is possible to provide the first and second dummy word driver blocks 8 and 9, the first and second dummy switch block 13 and 14, and the first and second dummy sense amplifier blocks 16 and 17 as spaces for increasing the distances La through Lf each from the end of the relevant gate electrode to the end of the relevant diffusion layer.

In the word driver block according to the present embodiment, the N-ch MOS transistor's diffusion layers located at the upper end and the lower end may further each have an unoperable transistor, which is described below with reference to FIG. 11.

Figure 11:
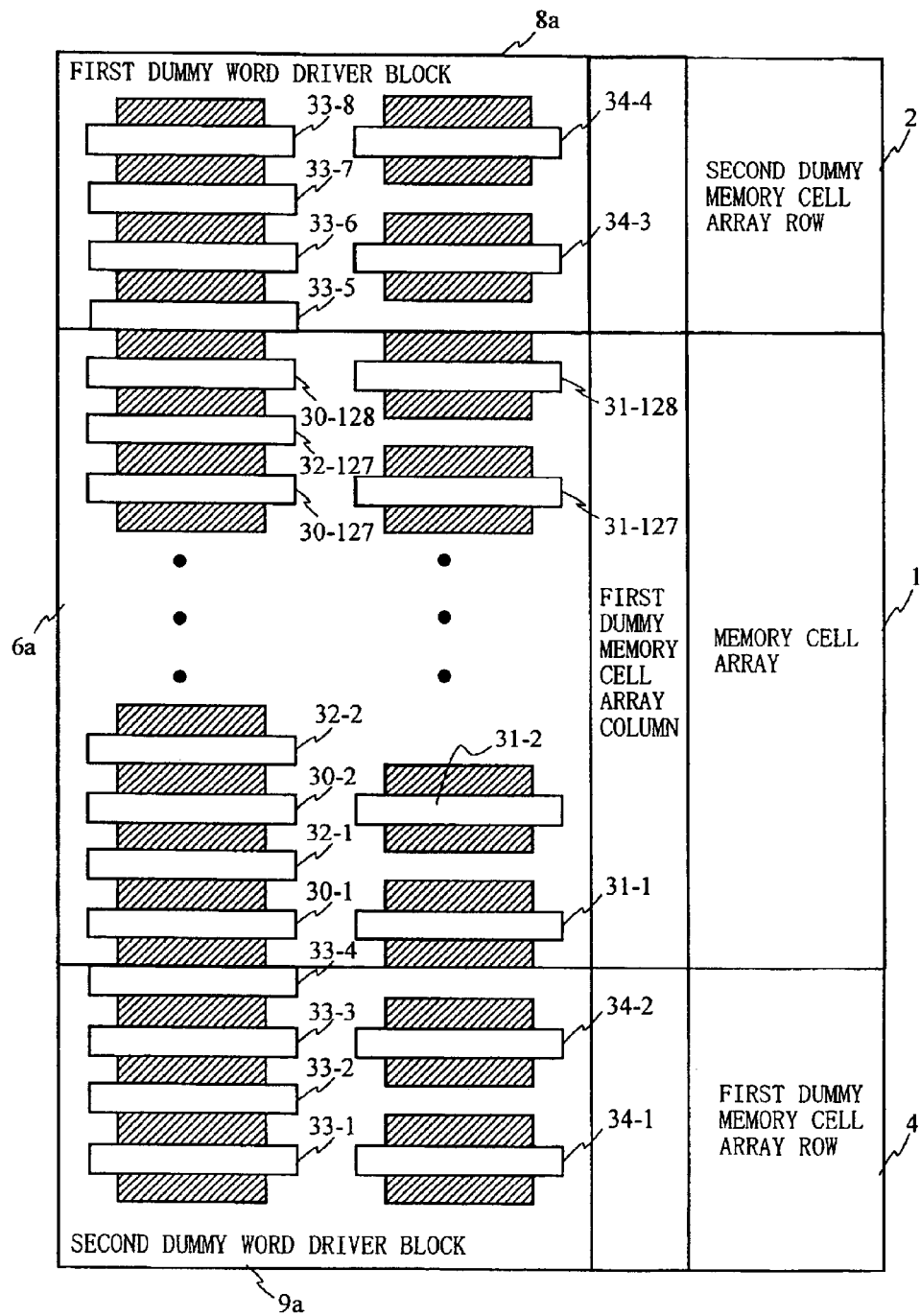
FIG. 11 is an illustration showing another exemplary arrangement of transistors in the word driver block and the first and second dummy word blocks.
Figure 12:
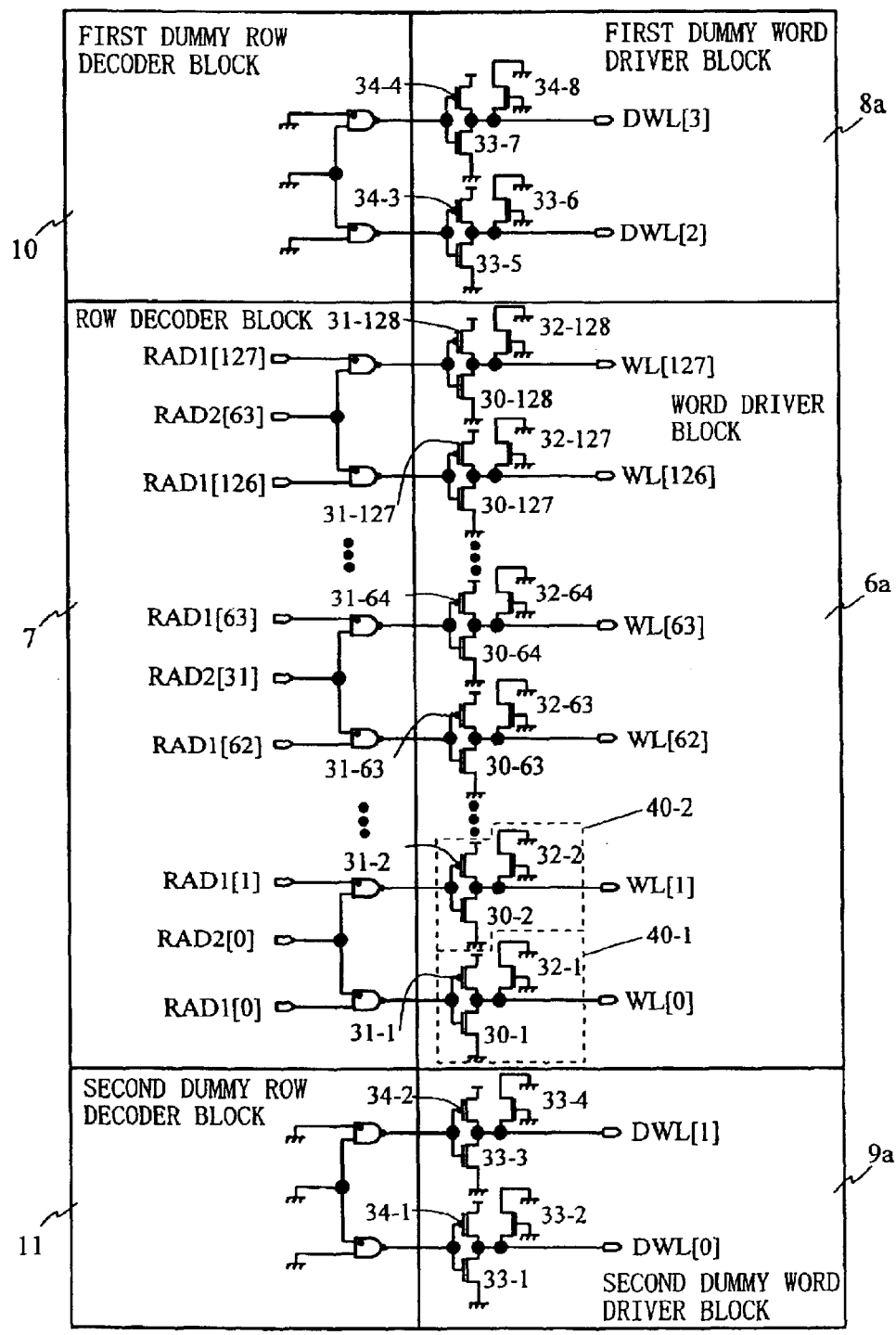
FIG. 12 is an illustration showing another exemplary circuitry configuration of the word driver block, the first and second dummy word blocks, the row decoder block, and the first and second dummy row decoder blocks.
Figure 13:
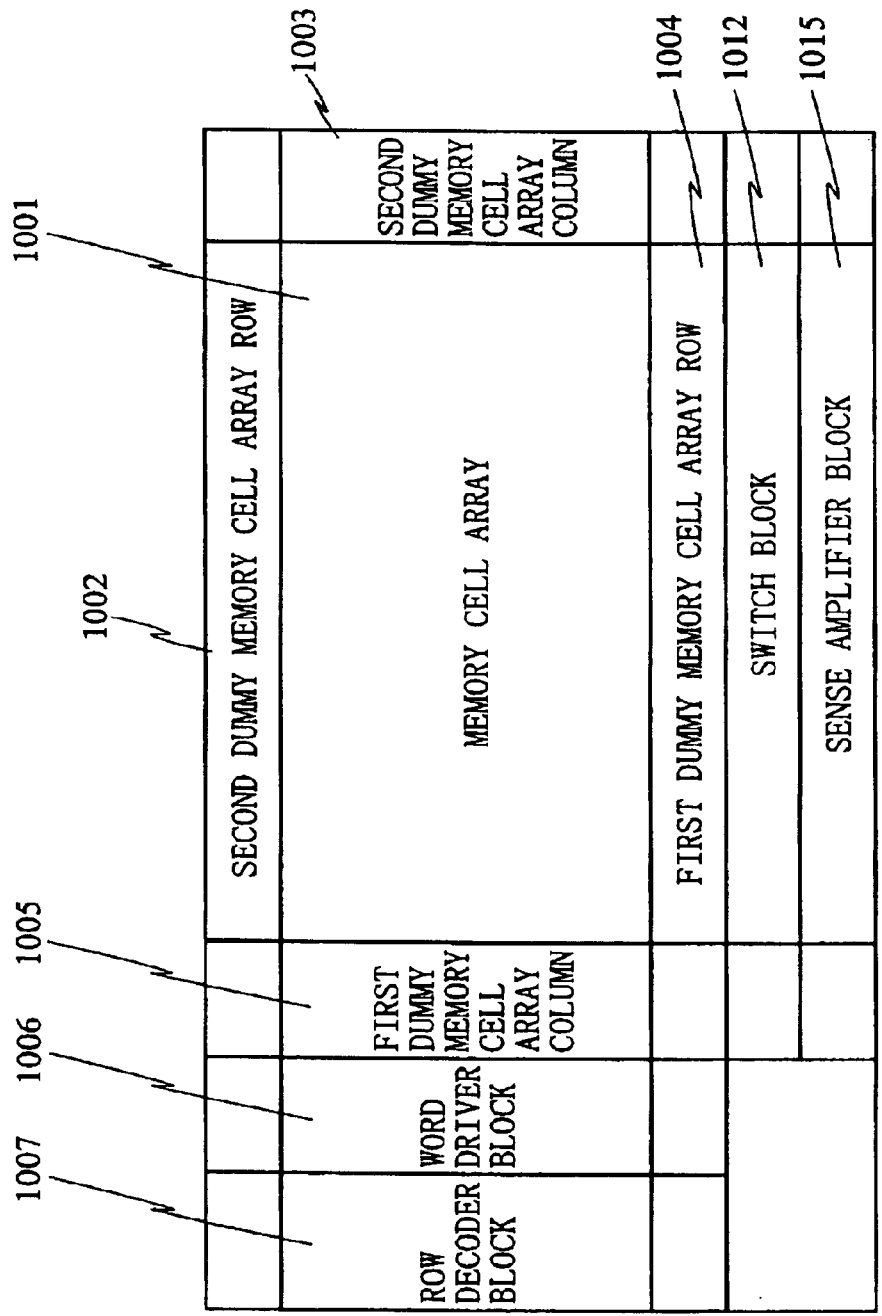
FIG. 13 is a block diagram showing a configuration of a conventional semiconductor memory device.

FIG. 11 is an illustration showing the arrangement of N-ch MOS transistors 33-1 through 33-8 and P-ch MOS transistors 34-1 through 34-4 formed in a first dummy word driver block 8a and a second dummy word driver block 9a. Specifically, an active region (a diffusion layer or a channel region) of the N-ch MOS transistor 30-1 extends to as far as the inside of the second dummy word block 9a. On this active region, the N-ch MOS transistors 33-1 through 33-4 are provided. Similarly, an active region of the N-ch MOS transistor 30-128 extends to as far as the inside of the first dummy word block 8a. On this active region, the N-ch MOS transistors 33-5 through 33-8 are provided. Further, in the second dummy word driver block 9a located at the lower side of the P-ch MOS transistor 31-1, the P-ch MOS transistors 34-1 and 34-2 are arranged. Also, in the first dummy word driver block 8a located at the upper side of the P-ch MOS transistor 31-128, the P-ch MOS transistors 34-3 and 34-4 are arranged. FIG. 11 is different from FIG. 2 only in that the N-ch MOS transistors 33-1 through 33-8 and the P-ch MOS transistors 34-1 thorough 34-4 are further provided. Note that FIG. 12 is an illustration showing a circuitry configuration of a word driver block 6a, the first and second dummy word driver blocks 8a and 9a, the row decoder block 7, and the first and second dummy row decoder blocks 10 and 11.

As described above, the N-ch MOS transistors 33-1 through 33-8 are provided in the first and second dummy word driver blocks 8a and 9a formed by the first and second dummy memory cell array rows 4 and 2 where unoperable dummy memory cells are provided. With this, the active regions of the N-ch MOS transistors provided at the upper and lower ends of the word driver block 6a can be made long. As a result, the electric current flowing through the N-ch MOS transistors provided at those ends can be increased.

In the present embodiment, an SRAM is exemplarily described. The similar effects can be achieved by a dynamic random access memory (DRAM), flash memory, read-only memory (ROM), ferroelectric memory, or magnetic memory (MRAM).

Also, in the present embodiment, description is made exemplarily to a semiconductor memory device. However, such embedding of an N-ch MOS transistor between adjacent N-ch MOS transistors can be applied to another semiconductor device. Such a semiconductor device may be arbitrary as long as it has semiconductor elements, such as memory cells, that are arranged in an array and are surrounded by transistors periodically arranged. An example of such a semiconductor device is a solid-state image sensing device.

While the invention has been described in detail, the foregoing description is in all aspects illustrative and not restrictive. It is understood that numerous other modifications and variations can be devised without departing from the scope of the invention.

What is claimed is:

1. A semiconductor device in which a plurality of elements identical in structure are arranged in an array, the semiconductor device comprising:

a plurality of transistors arranged in an area surrounding the plurality of elements arranged in the array, at a spacing depending on a spacing of the plurality of elements, for driving the plurality of elements; and a plurality of dummy transistors each of which is formed between two adjacent ones of the plurality of transistors so as to share diffusion layers with the adjacent transistors and each of which has a gate electrode supplied with a voltage for electrically insulating the adjacent transistors.

2. A semiconductor memory device in which a plurality of memory cells are arranged in an array, the semiconductor device comprising:

a plurality of transistors arranged in an area surrounding the plurality of memory cells arranged in the array, at a spacing depending on a spacing of the plurality of memory cells, for driving the plurality of memory cells; and a plurality of dummy transistors each of which is formed between two adjacent ones of the plurality of transistors so as to share diffusion layers with the adjacent transistors and each of which has a gate electrode supplied with a voltage for electrically insulating the adjacent transistors.

3. The semiconductor memory device according to claim 2, wherein the plurality of transistors are N-ch MOS transistors.

4. The semiconductor memory device according to claim 3, wherein a plurality of P-ch MOS transistors are arranged in parallel to the plurality of N-ch MOS transistors in the area surrounding the plurality of memory cells arranged in the array.

5. The semiconductor memory device according to claim 4, wherein an N-ch MOS transistor located at an end of an arrangement of the plurality of N-ch transistors has a diffusion layer that is longer than a diffusion layer of a P-ch MOS transistor located at an end of an arrangement of the plurality of P-ch transistors.

6. The semiconductor memory device according to claim 5, wherein at least one of the dummy transistors is formed outside of the N-ch MOS transistor located at the end.

7. The semiconductor memory device according to claim 3, wherein the plurality of memory cells are arranged in the array in a first rectangular area, the semiconductor memory device further comprises a plurality of unoperable dummy memory cells arranged so as to surround sides of the first rectangular area, the plurality of N-ch MOS transistors are arranged in a second rectangular area adjacent to a dummy-memory-cell area in which the plurality of dummy memory cells are arranged and having one side corresponding to one side of the first rectangular area, and an N-ch MOS transistor located at an end of an arrangement of the N-ch MOS transistors in the second rectangular area has an active region extending to a third area that is in contact with the second rectangular area that includes the plurality of N-ch MOS transistors and in contact with a part of one side of the dummy-memory-cell area.

8. The semiconductor memory device according to claim 7, wherein at least one of the dummy transistors is formed on the active region extending to the third area.

9. The semiconductor memory device according to claim 4, wherein the plurality of N-ch MOS transistors and the plurality of P-ch MOS transistors are respectively isolated through Shallow Trench Isolation (STI).

10. The semiconductor memory device according to claim 4, wherein the plurality of N-ch MOS transistors and the plurality of P-ch MOS transistors are used for word drivers for driving a plurality of word lines for selecting a row of the memory cells arranged in the array.

11. The semiconductor memory device according to claim 10, wherein one of the plurality of N-ch MOS transistors and one of the plurality of P-ch MOS transistors form a CMOS inverter, and an output of the CMOS inverter is coupled to a word line and a diffusion layer of one of the dummy transistors.

12. The semiconductor memory device according to claim 4, wherein the plurality of N-ch MOS transistors and the plurality of P-ch MOS transistors are used for a plurality of switches for driving a plurality of bit lines for reading a signal from the plurality of memory cells.

13. The semiconductor memory device according to claim 12, wherein each of the switches is configured by connecting a diffusion layer of one of the N-ch MOS transistors and a diffusion layer of one of the P-ch MOS transistors together and connecting a gate of the one of the N-ch MOS transistors and a gate of the one of the P-ch MOS transistors through a signal line.

14. The semiconductor memory device according to claim 4, wherein the plurality of N-ch MOS transistors and the plurality of P-ch MOS transistors are used for a plurality of sense amplifiers that amplify the signal read from the plurality of memory cells.

15. The semiconductor memory device according to claim 14, wherein each of the dummy transistors is placed so as to connect diffusion layers of N-ch MOS transistors included in adjacent sense amplifiers.

16. The semiconductor memory device according to claim 15, wherein a diffusion layer of each of the dummy transistor is connected to a signal line to which the signal amplified by the sense amplifier is output.

* * * * *